(12) United States Patent
Yatsuda et al.

(10) Patent No.: US 7,871,908 B2
(45) Date of Patent: Jan. 18, 2011

(54) METHOD OF MANUFACTURING SEMICONDUCTOR DEVICE

(75) Inventors: Koichi Yatsuda, Nirasaki (JP); Eiichi Nishimura, Nirasaki (JP)

(73) Assignee: Tokyo Electron Limited (JP)

( * ) Notice: Subject to any disclaimer, the term of this patent is extended or adjusted under 35 U.S.C. 154(b) by 123 days.

(21) Appl. No.: 12/407,854

(22) Filed: Mar. 20, 2009

(65) Prior Publication Data

US 2010/0144155 A1    Jun. 10, 2010

(30) Foreign Application Priority Data

Dec. 5, 2008    (JP) ............................. 2008-311149

(51) Int. Cl.
     *H01L 21/425* (2006.01)
(52) U.S. Cl. .................. 438/531; 438/948; 438/975; 257/E21.025; 257/E21.031
(58) Field of Classification Search ................ 438/531, 438/948, 975, 700; 257/E21.025, E21.016, 257/E21.346, E21.024, E21.031, E21.314, 257/E21.131; 430/5
See application file for complete search history.

(56) References Cited

U.S. PATENT DOCUMENTS

| | | | | |
|---|---|---|---|---|
| 4,342,817 A | * | 8/1982 | Bohlen et al. ................... | 430/5 |
| 5,527,662 A | * | 6/1996 | Hashimoto et al. .......... | 438/949 |
| 5,547,787 A | * | 8/1996 | Ito et al. ........................ | 430/5 |
| 7,148,120 B2 | * | 12/2006 | Chen et al. ................... | 438/421 |
| 7,662,721 B2 | * | 2/2010 | Manger et al. .............. | 438/717 |
| 2006/0063348 A1 | * | 3/2006 | Chen et al. ................... | 438/403 |
| 2007/0243707 A1 | * | 10/2007 | Manger et al. .............. | 438/669 |
| 2008/0194107 A1 | * | 8/2008 | Mitsuiki et al. ............. | 438/699 |
| 2009/0311634 A1 | * | 12/2009 | Yue et al. ..................... | 430/323 |
| 2010/0144155 A1 | * | 6/2010 | Yatsuda et al. .............. | 438/700 |

FOREIGN PATENT DOCUMENTS

| | | |
|---|---|---|
| JP | 09-205081 | 8/1997 |
| JP | 2007-335450 | 12/2007 |

\* cited by examiner

*Primary Examiner*—Walter L Lindsay, Jr.
(74) *Attorney, Agent, or Firm*—Cantor Colburn LLP

(57) ABSTRACT

The method of manufacturing a semiconductor device comprising: forming a first hard mask layer and a second hard mask layer on the layer to be etched (S11); a first groove-forming mask pattern forming process for forming a groove-forming mask pattern which has a first pitch, is formed of the second hard mask layer, and is used as an etching mask when forming groove patterns(S12-S14); and a first concave portion-forming mask pattern forming process for etching the first hard mask layer using the second resist pattern as an etching mask, wherein the second resist pattern is formed of the second resist layer having an opening portion that has a fourth pitch and the first organic layer having an opening portion that is connected to an opening portion of the second resist layer and has a smaller size than the opening portion of the second resist layer (S15-S18).

11 Claims, 25 Drawing Sheets

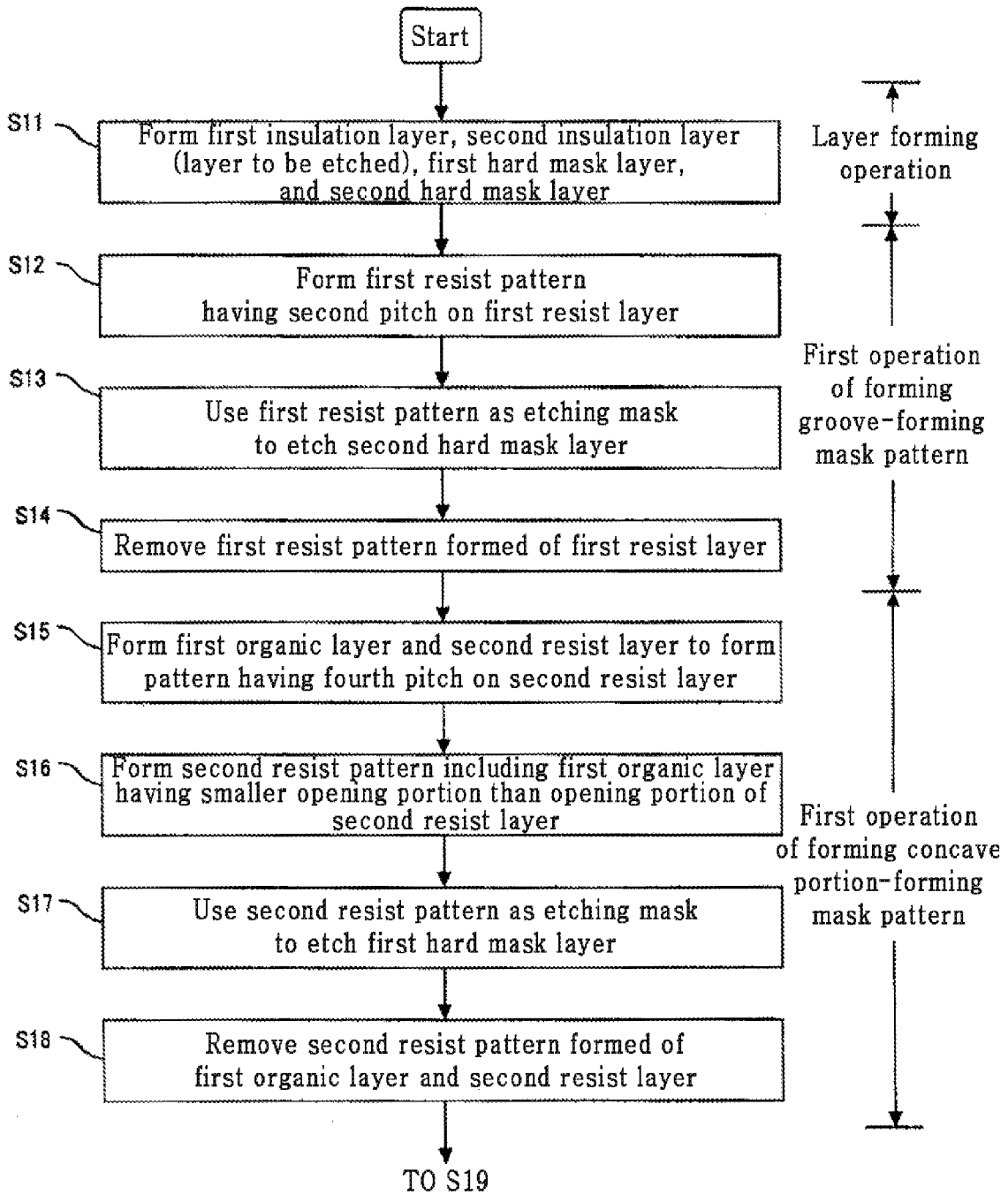

(e)

(f)

(g)

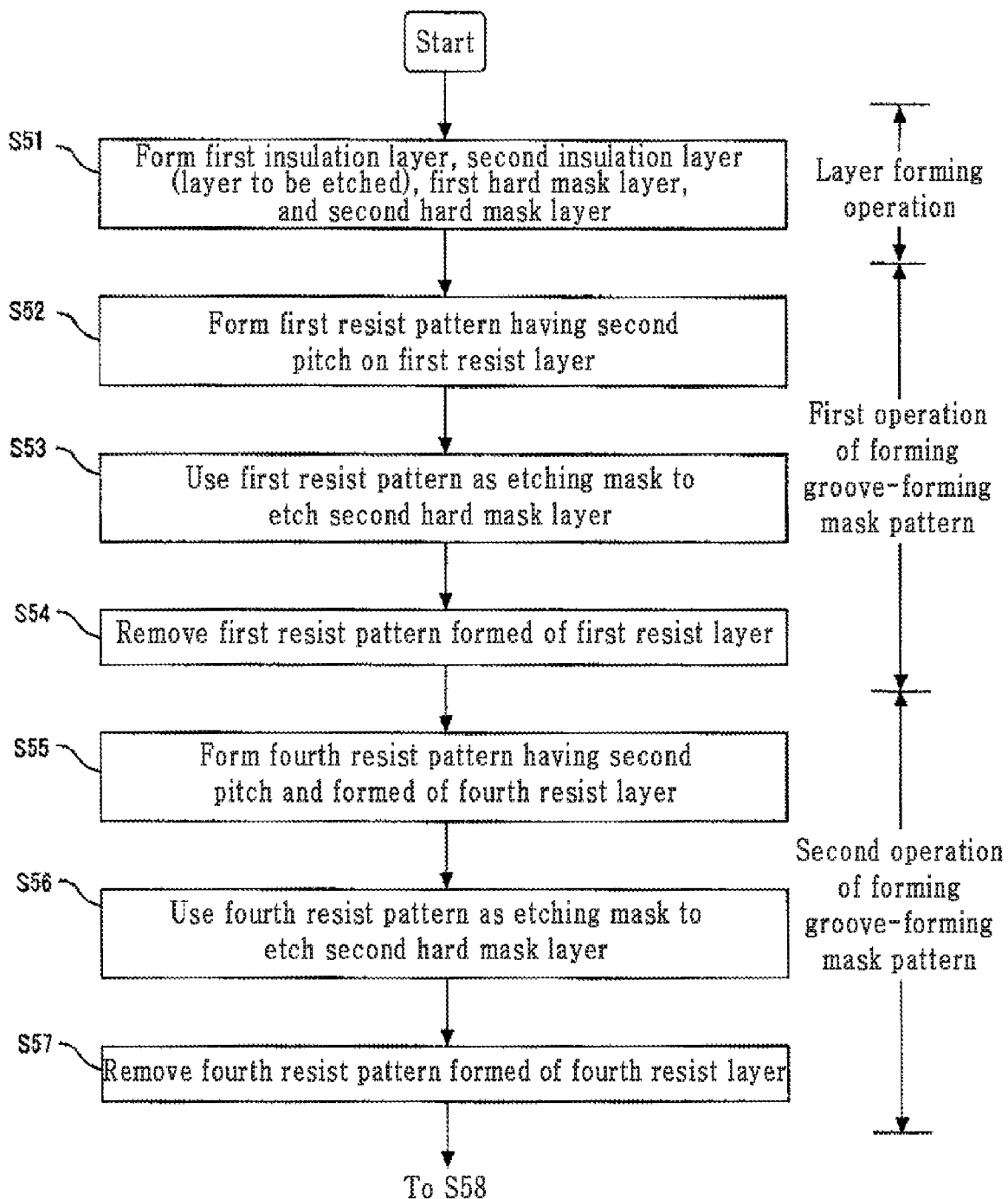

(e)

(f)

(g)

METHOD OF MANUFACTURING SEMICONDUCTOR DEVICE

CROSS-REFERENCE TO RELATED PATENT APPLICATIONS

This application claims the benefit of Japanese Patent Application No. 2008-311149, filed on Dec. 5, 2008, in the Japan Patent Office, the disclosure of which is incorporated herein in its entirety by reference.

BACKGROUND OF THE INVENTION

1. Field of the Invention

The present invention relates to a method of manufacturing a semiconductor device which is used in a semiconductor manufacturing process, and more particularly, to a method of manufacturing a semiconductor device by which the CDs of patterns of minute grooves (trenches) and holes (vias) can be formed with high accuracy when a multi-layer wiring pattern below a predetermined resolution limit is formed using a dual damascene method.

2. Description of the Related Art

As semiconductor devices have become more highly integrated, wirings or separation widths required in a manufacturing process thereof have also become minute. In general, minute patterns are formed by forming a resist pattern using a photolithography process and etching various layers on a base layer using the resist pattern as an etching mask. Accordingly, although the photolithography process is important in terms of forming minute patterns, currently, even more minute patterns below a resolution limit of the photolithography process are required in the case of many semiconductor devices. Also, it is known that the resolution of an ArF liquid immersion exposure technique, which is currently performed in mainstream, has reached the limit in the 4×nm generation. Accordingly, a double patterning (DP) technique for achieving the smaller 3×nm generation has been currently vigorously developed.

Techniques of forming such patterns below a predetermined resolution limit are disclosed, for example, in Reference 1.

Reference 1 discloses a method in which a plurality of first photosensitive layer patterns, hereinafter referred to as first resist patterns, are formed, the first resist patterns are then baked, and an oxide layer is formed on the first resist patterns. Then, a plurality of second photosensitive layer patterns, hereinafter referred to as second resist patterns, are formed between the first resist patterns, and a thin layer of the base layer is etched using the first resist patterns and the second resist patterns as etching masks to form minute patterns. Such method is referred to as a lithography lithography etching (LLE) process.

According to Reference 1, minute patterns are formed using two exposure masks, and thus the minute patterns can be formed to have a line width that is smaller by half or more than that of minute patterns formed using one exposure mask. Thus, minute patterns can be formed below a predetermined resolution limit.

Meanwhile, as the semiconductor devices have become highly integrated, wirings between semiconductor devices have also become minute. In this case, however, a large capacity is generated between the wirings and thus a signal transmission speed is decreased, thereby causing delay in the operational speed. To address this problem, recently, an insulation material (low-k material) having a low relative permittivity is used as an interlayer insulation layer, and copper (Cu), which is low-resistive and has excellent resistance to electromigration, has been used as a wiring material. Also, a dual damascene method has been widely used for forming groove wirings or contact holes formed of copper.

Multi-layer Cu wirings are formed in the dual damascene method by forming an etching stop layer on a lower Cu wiring, forming a low-k layer thereon as an interlayer insulation layer, and sequentially forming a metal hard mask layer, a bottom anti-reflection coating (BARC), and a photoresist layer on the low-k layer. Then, the low-k layer is etched to form a via, a trench is etched, and then the etching stop layer is etched to connect the via, thereby additionally forming a buried Cu wiring layer.

A technique of forming multi-layer Cu wirings by using the dual damascene method is disclosed in Reference 2.

Reference 1: Japanese Patent No. 2757983; and

Reference 2: Japanese Laid-Open Patent Publication No. 2007-335450.

When patterns of multi-layer Cu wirings are formed by making patterns such as grooves (trench) and holes (via) below a predetermined resolution limit using a dual damascene method, the following problems occur.

In order to form minute patterns such as holes (vias) and grooves (trenches) below a predetermined resolution limit, a photolithography process using masks corresponding to each pattern, that is, the holes (vias) and grooves (trenches), needs to be performed. However, due to the limit of the exposure technique, in other words, due to a predetermined resolution limit, it is not possible to form pitches of 90 nm or smaller.

Also, a conventional lithography lithography etching (LLE) process includes forming a resist pattern twice using a photolithography process. In this case, when forming a second resist pattern, the shape of a first resist pattern is maintained and the second resist pattern is formed between the first resist patterns. Thus, the LLE process can be applied for forming a gate layer of a field effect transistor (FET) which has convex patterns. On the other hand, when forming concave patterns such as holes (vias) and grooves (trenches), it is necessary to form opening portions of the second resist pattern on the first resist pattern. Thus, the shape of the first resist pattern cannot be maintained when the second resist pattern are formed. Accordingly, the conventional LLE process cannot be applied in the dual damascene method of forming holes (vias) and grooves (trenches).

Also, when the dual damascene method is performed using a single hard mask layer, etching of one of the grooves (trenches) and the holes (vias) needs to be necessarily conducted using a resist pattern as an etching mask. When a resist pattern is used as an etching mask, most likely, the shape of the resist pattern changes because the etching rate of the low-k layer to a resist layer (selectivity) is not high. Since the resist layer is also etched when the low-k layer is etched, the shape of the resist pattern may be easily deteriorated. As a result, when minute patterns are formed, the transfer accuracy of the shapes of resist patterns transferred onto the low-k layer cannot be guaranteed.

Also, when the dual damascene method is performed using a photoresist as an etching mask and a via-first method, in which a hole (via) is first formed in a layer to be etched and then a groove (trench) is formed, deterioration of characteristics and shape is generated as the low-k layer is exposed to $O_2$ plasma in an ashing process to remove the photoresist. In particular, due to the shape deterioration, a critical dimension (CD) of patterns is not within a desired dimensional range.

SUMMARY OF THE INVENTION

The present invention provides a method of manufacturing a semiconductor device by which the CDs of minute patterns such as grooves (trenches) and holes (vias) can be formed with high accuracy when forming multi-layer Cu wiring patterns below a predetermined resolution limit using a dual damascene method.

To solve the above and/or other problems, the present invention provides a method of manufacturing a semiconductor device including the following operations.

According to an aspect of the present invention, a method of manufacturing a semiconductor device, the semiconductor device comprising a semiconductor substrate and a layer to be etched formed on the semiconductor substrate, wherein a groove and a concave portion are formed in the layer to be etched, and the concave portion is formed at a bottom of the groove and has a smaller opening portion than an opening portion of the groove, the method comprising: sequentially forming a first hard mask layer and a second hard mask layer on the layer to be etched; a first groove-forming mask pattern forming process which forms a groove-forming mask pattern which has a first pitch, is formed of the second hard mask layer, and is used as an etching mask when forming groove patterns, by forming a first resist layer on the second hard mask layer in order to form a first resist pattern that has a second pitch and is formed of the first resist layer, and etching the second hard mask layer using the first resist pattern as an etching mask; and a first concave portion-forming mask pattern forming process which forms a concave portion-forming mask pattern which has a third pitch substantially identical to the first pitch, is formed of the first hard mask layer, and is used as an etching mask when forming concave portion patterns, by sequentially forming a first organic layer and a second resist layer on the first hard mask layer, on which the groove-forming mask pattern is formed, in order to form a second resist pattern comprising the second resist layer having an opening portion that has a fourth pitch and the first organic layer having an opening portion that is connected to an opening portion of the second resist layer and has a smaller size than the opening portion of the second resist layer, and etching the first hard mask layer using the second resist pattern as an etching mask.

According to the present invention, a concave portion refers to both a hole whose bottom surface is formed not through to a lower surface of a layer to be etched but closed at an end, and a hole whose bottom surface is formed through to the lower surface of the layer to be etched. Hereinafter, the concave portion will be referred to as a concave portion (hole or via).

In addition, the first pitch refers to a pitch of a groove (trench), and the third pitch refers to a pitch of the patterns of the concave portion (hole or via), and the first pitch and the third pitch are equal to each other or approximately equal to each other. Also, the second pitch is a pitch of the first resist pattern for forming a pitch of the groove (trench), and may be equal to the first pitch. Alternatively, in order to form the first resist pattern to correspond to every other pattern of the pattern of the groove (trench) or to every third pattern or fourth pattern and so on, the second pitch may be larger than the first pitch. Also, the fourth pitch is a pitch of the second resist pattern for forming a pitch of the patterns of the concave portion (hole or via), and may be the same as the third pitch. Alternatively, in order to form the second resist pattern to correspond to every other pattern of the pattern of the concave portion (hole or via) or to every third pattern or fourth pattern and so on, the fourth pitch may be larger than the third pitch.

The fourth pitch may be larger than the third pitch, and after the first concave portion-forming mask pattern forming process, the method further comprising a second concave portion-forming mask pattern forming process which comprises: sequentially forming a second organic layer and a third resist layer in order to form a third resist pattern comprising the third resist layer having an opening portion that has the fourth pitch and the second organic layer that has an opening portion that is connected to an opening portion of the third resist layer and has a smaller size than the opening portion of the third resist layer, and etching the first hard mask layer using the third resist pattern as an etching mask.

Also, a pitch of the third resist pattern is the fourth pitch which is equal to the pitch of the second resist pattern. Thus, for example, if the fourth pitch is twice as large as the third pitch, patterns formed by the second resist pattern and the third pattern become patterns of the concave portion (hole or via).

The second pitch may be larger than the first pitch, and after the first groove-forming mask pattern forming process, the method further comprising a second groove-forming mask pattern forming process which comprises: forming a fourth resist layer in order to form a fourth resist pattern which has the second pitch and is formed of the fourth resist layer, and etching the second hard mask layer by using the fourth resist pattern as an etching mask.

Also, a pitch of the fourth resist pattern is the second pitch which is equal to the pitch of the first resist pattern. Thus, for example, if the second pitch is twice as large as the first pitch, patterns formed by the first resist pattern and the fourth resist pattern become patterns of the groove (trench).

The method may further comprise: groove and concave portion forming process for forming a groove and a concave portion, by etching the layer to be etched by using the concave portion-forming mask pattern formed of the first hard mask layer as an etching mask, and etching the first hard mask layer and the layer to be etched by using the groove-forming mask pattern formed of the second hard mask layer as an etching mask.

The semiconductor device may further comprise: a first wiring that is formed on the semiconductor substrate and under the layer to be etched; a second wiring formed in the groove; and an electrode that is formed in the concave portion and connects the first wiring and the second wiring.

An opening portion of the first organic layer may have a tapered sidewall surface.

An opening portion of the second organic layer may have a tapered sidewall surface.

The sidewall surface of the opening portion of the first organic layer may be formed by attaching a reactant product of an etching gas to the sidewall surface of the opening portion of the first organic layer and etching the sidewall surface.

The sidewall surface of the opening portion of the second organic layer is formed by attaching a reactant product of an etching gas to the sidewall surface of the opening portion of the second organic layer and etching the sidewall surface.

The etching gas may comprise one of $CF_4$ and $CHF_3$.

BRIEF DESCRIPTION OF THE DRAWINGS

The above and other features and advantages of the present invention will become more apparent by describing in detail exemplary embodiments thereof with reference to the attached drawings in which:

FIG. 1A is a first flowchart illustrating a method of manufacturing a semiconductor device according to an embodiment of the present invention;

FIG. 2B illustrates second schematic cross-sectional views for explaining the method of manufacturing a semiconductor device of FIGS. 1A and 1B, and showing the structure of a minute pattern formed in each operation of the method of;

FIG. 6A is a first flowchart illustrating a method of manufacturing a semiconductor device according to other embodiment of the present invention;

DETAILED DESCRIPTION OF THE INVENTION

Figure 1B:
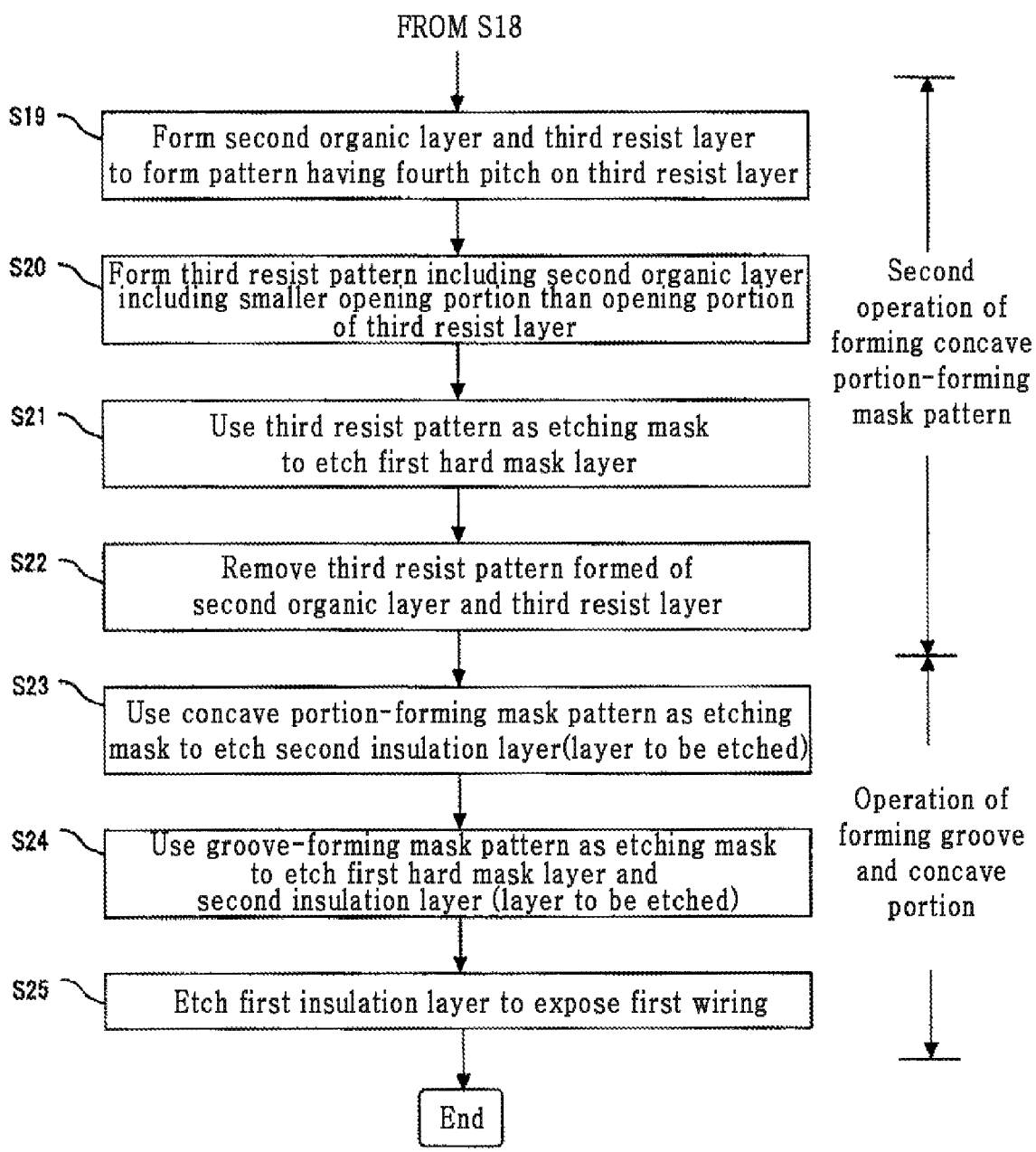
FIG. 1B is a second flowchart illustrating the method of manufacturing a semiconductor device according to the embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Methods of manufacturing a semiconductor device according to embodiments of the present invention differ from one another in that whether a lithography lithography etching (LLE) process, which is a double patterning process, is performed or not in an operation of forming a groove-forming mask pattern (trench) or in an operation of forming a concave portion-forming mask pattern (hole or via). That is, in an embodiment illustrated in FIGS. 1A and 1B, the LLE process is performed in an operation of forming a concave portion-forming mask pattern. In another embodiment illustrated in FIGS. 4A and 4B, the LLE process is performed both in an operation of forming a groove-forming mask pattern and in an operation of forming a concave portion-forming mask pattern. In another embodiment illustrated in FIGS. 6A and 6B, the LLE process is performed in an operation of forming a groove-forming mask pattern. In another embodiment illustrated in FIG. 8, the LLE process is performed neither in an operation of forming a groove-forming mask pattern nor in an operation of forming a concave portion-forming mask pattern.

First Embodiment

A method of manufacturing a semiconductor device and a layer formation apparatus according to an embodiment of the present invention will be described with reference to FIGS. 1A through 3.

First, the method of manufacturing a semiconductor device according to the embodiment of the present invention will be described with reference to FIGS. 1A through 2D.

FIGS. 1A and 1B are flowcharts illustrating the method of manufacturing a semiconductor device according to the embodiment of the present invention. FIGS. 2A through 2D are cross-sectional views for explaining the method of FIGS. 1A and 1B of manufacturing a semiconductor device, and show minute patterns formed in each operation of the method. The minute patterns formed in operations S11 through S25 of FIGS. 1A and 1B correspond to the structures illustrated in the cross-sectional views of FIGS. 2A(a) through 2D(o), respectively. Also, FIG. 2D(p) is a cross-sectional view illustrating the structure of the minute pattern on which a second wiring is formed after the above operations are performed.

As illustrated in FIGS. 1A and 1B, the method of manufacturing a semiconductor device according to the current embodiment includes a layer forming operation, a first operation of forming a groove-forming mask pattern, a first operation of forming a concave portion-forming mask pattern, a second operation of forming a concave portion-forming mask pattern, and an operation of forming a groove and a concave portion. The layer forming operation includes operation S11, the first operation of forming a groove-forming mask pattern includes operations S12 through S14, the first operation of forming a concave portion-forming mask pattern includes operations S15 through S18, the second operation of forming a concave portion-forming mask pattern includes operations S19 through S22, and the operation of forming a groove and a concave portion includes operations S23 through S25.

That is, the method of manufacturing a semiconductor device according to the current embodiment is characteristic in that an LLE process in which a second resist pattern is formed between first resist patterns is performed in the operation of forming a concave portion-forming mask pattern in which a concave portion-forming mask pattern (hole or via) is formed.

In the method of manufacturing a semiconductor device according to the current embodiment, a semiconductor device including a first wiring formed on a semiconductor substrate, a second wiring formed above the first wiring, and an electrode that is formed between the first and second wirings and connecting the first and second wirings is manufactured. The method further includes forming a groove (trench) and a concave portion (hole or via) for forming the second wiring and the electrode (the via electrode) after forming the first wiring.

According to the method of manufacturing a semiconductor device of the current embodiment, a semiconductor substrate 100 on which a first wiring 102 is formed in advance is provided. A groove (trench) for forming a first wiring, which is coated with a barrier metal layer 101 on lateral and lower surfaces, is formed in the semiconductor substrate 100. The first wiring 102 is formed to cover the groove (trench) for forming the first wiring 102.

For example, the barrier metal layer 101 formed of tantalum (Ta) is formed using a sputtering method. Next, a seed layer formed of Cu is deposited, and the first wiring 102 formed of Cu is formed using a plating method. Further, the first wiring 102 and the barrier metal layer 101 formed of Ta are polished and removed, using a chemical mechanical polishing (CMP) method in which colloidal silica slurry is used as a polishing material, to be planarized.

Also, a thickness of the barrier metal layer 101 may be, but is not limited to, for example, 10-100 nm. Also, a thickness of the first wiring 102 which is determined as a depth of the filled groove (trench) may be, but is not limited to, for example, 50-1500 nm.

Figure 2A:
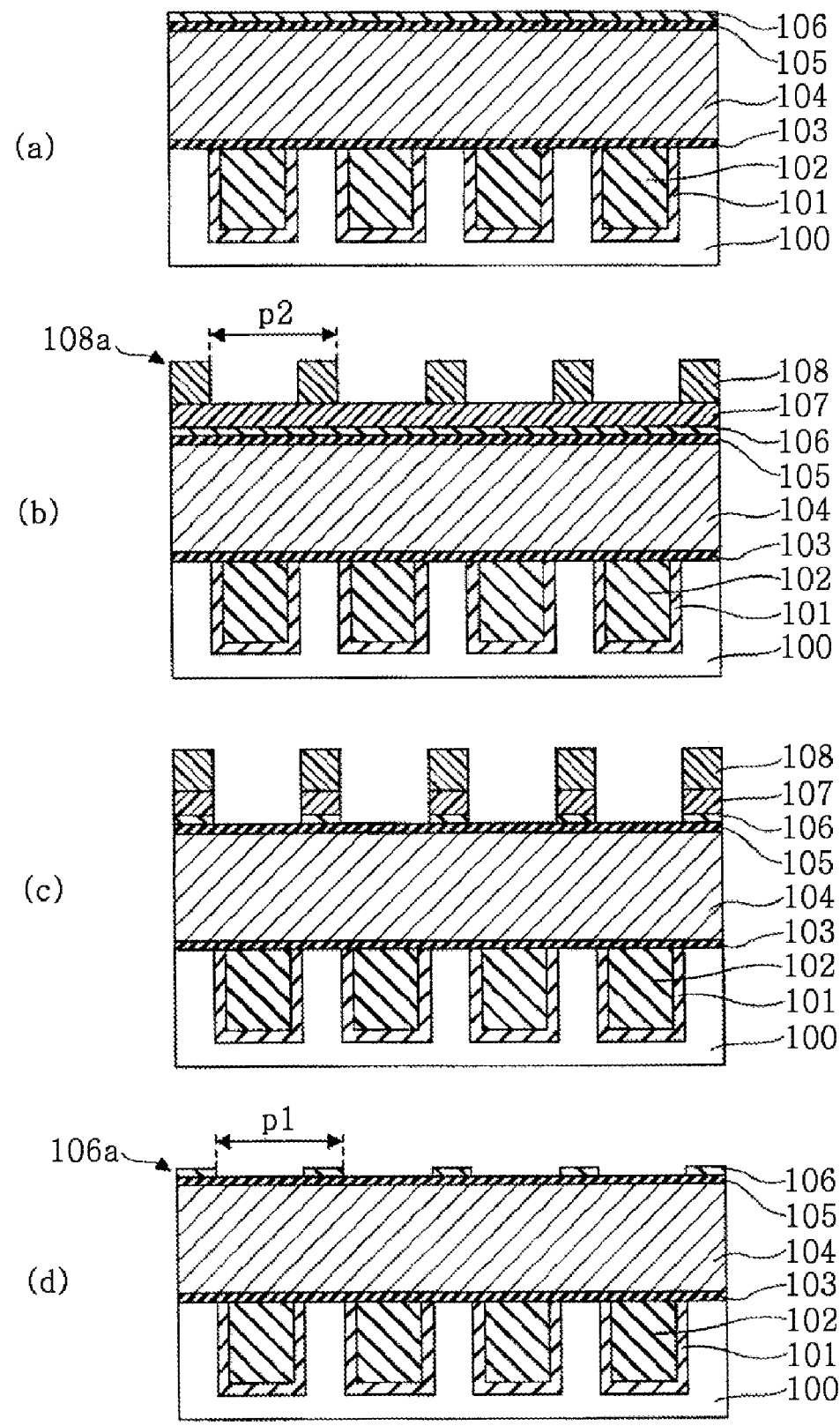
FIG. 2A illustrates first schematic cross-sectional views for explaining the method of manufacturing a semiconductor device of FIGS. 1A and 1B, and showing the structure of a minute pattern formed in each operation of the method.

First, a layer forming operation including operation S11 is performed. In operation S11, a first hard mask layer 105 and a second hard mask layer 106 are formed. FIG. 2A(a) is a cross-sectional view illustrating the structure of the semiconductor substrate 100 after operation S11 is performed.

In operation S11, as illustrated in FIG. 2A(a), the first wiring 102 is formed using the barrier metal layer 101, and an etching stop layer 103, an insulation layer 104, the first hard mask layer 105, and the second hard mask layer 106 are sequentially formed to cover the planarized semiconductor substrate 100.

Also, according to the present invention, the insulation layer 104 corresponds to a layer to be etched.

First, the etching stop layer 103 is formed. The etching stop layer 103 is for finishing etching of the insulation layer 104, and functions also as a diffusion prevention layer in relation to the first wiring 102 formed of Cu. For example, the etching stop layer 103 may be a SiC layer. The etching stop layer 103 formed of a SiC layer may be formed using, for example, a chemical vapor deposition (CVD) method. A thickness of the etching stop layer 103 may be, but is not limited to, 10-100 nm.

Next, the insulation layer (the layer to be etched) 104 is formed. The insulation layer (the layer to be etched) 104 is formed on a concave portion (hole or via) 104c, which will be described with reference to FIG. 2D(p), between the first wiring 102 and a second wiring 114, which will also be described with reference to FIG. 2D(p). The insulation layer (the layer to be etched) 104 functions as a low permittivity layer, hereinafter referred to as a low-k layer, for reducing a parasitic capacitance of an electrode (a via electrode 115) connecting the first wiring 102 and the second wiring 114. The insulation layer (the layer to be etched) 104 may be formed of, for example, a SiCOH layer, which is referred to as a carbon-containing silicon oxide layer.

The insulation layer (the layer to be etched) 104 formed of a SiCOH layer may be formed using, for example, a plasma CVD method. A thickness of the insulation layer 104 may be, but is not limited to, 500-1500 nm. Also, a p-SiCOH layer, which is a porous SiCOH layer, may be used as the insulation layer 104.

Next, the first hard mask layer 105 is formed. The first hard mask layer 105 operates in relation to the insulation layer 104 as a mask when forming a pattern such as a groove (trench) 104b in FIG. 2D(o). The first hard mask layer 105 may be formed of, for example, a SiC layer or a SiN layer. The first hard mask layer 105 formed of SiC or SiN may be formed using, for example, a plasma CVD method. A thickness of the first hard mask layer 105 may be, but is not limited to, 10-100 nm.

Next, the second hard mask layer 106 is formed. The second hard mask layer 106 operates in relation to the insulation layer 104 as a mask when forming a pattern such as the concave portion (hole or via) 104c in FIG. 2D(o), and may be formed of, for example, a Ti layer or a TiN layer. The second hard mask layer 106 formed of Ti or TiN may be formed using, for example, a plasma CVD method. A thickness of the second hard mask layer 106 may be, but is not limited to, 10-100 nm.

Next, the first operation of forming a groove-forming mask pattern is performed in operations S12 through S14. In the first operation of forming a groove-forming mask pattern, a groove-forming mask pattern 106a with a first pitch p1 is formed of the second hard mask layer 106. The groove-forming mask pattern 106a is used as a mask when forming a pattern such as the groove (trench) 104b on which the second wiring 114 illustrated in FIG. 2D(o) is formed.

In operation S12, a first resist pattern 108a having a second pitch p2 is formed of a first resist layer 108. FIG. 2A(b) is a cross-sectional view illustrating the structure of the semiconductor substrate 100 after operation S12 is performed.

In operation S12, as illustrated in FIG. 2A(b), a bottom anti-reflection coating (BARC) layer 107 and the first resist layer 108 are sequentially formed on the second hard mask layer 106, and then the first resist pattern 108a with the second pitch p2 is formed of the first resist layer 108 using a photolithography process.

The BARC layer 107 may be formed of, for example, amorphous carbon by using a CVD method, polyphenol by using a spin on method, or various organic materials including a photoresist such as an i-ray resist. Also, a thickness of the BARC layer 107 may be, but is not limited to, for example, 50-200 nm.

The first resist layer 108 may be formed of an ArF resist. Also, a thickness of the first resist layer 108 may be, but is not limited to, 50-200 nm.

In operation S13, the second hard mask layer 106 is etched using the first resist pattern 108a as an etching mask. FIG. 2A(c) is a cross-sectional view illustrating the structure of the semiconductor substrate 100 after operation S13 is performed.

In operation S13, the first resist pattern 108a which has the second pitch p2 and is formed of the first resist layer 108 illustrated in FIG. 2A(b) is used as an etching mask to etch the BARC layer 107 and the second hard mask layer 106 as illustrated in FIG. 2A(c). An etching gas may be a mixed gas formed of $C_4F_8$, CO, $O_2$, and Ar.

In operation S14, the first resist pattern 108a is removed. FIG. 2A(d) is a cross-sectional view illustrating the structure of the semiconductor substrate 100 after operation S14 is performed.

In operation S14, the first resist pattern 108a illustrated in FIG. 2A(b) which has the second pitch p2 and is formed of the first resist layer 108 is removed together with the BARC layer 107. For example, the first resist pattern 108a and the BARC layer 107 may be removed using an $O_2$ plasma ashing method. After the first resist pattern 108a and the BARC layer 107 are removed, the groove-forming mask pattern 106a that has the first pitch p1 is formed of the second hard mask layer 106 as illustrated in FIG. 2A(d).

Also, in operation S14, when the first resist pattern 108a and the BARC layer 107 are removed using the $O_2$ plasma ashing method, since the insulation layer 104 is coated with the first hard mask layer 105, deterioration of the characteristics or the shape of the insulation layer 104, which is formed of a low-k layer, does not occur.

Also, according to the current embodiment, the second pitch p2 is equal to the first pitch p1, and thus the groove-forming mask pattern 106a having the first pitch p1 can be formed by performing the first operation of forming a groove-forming mask pattern. That is, if the first pitch p1 is not below a predetermined resolution limit, the groove-forming mask pattern 106a having the first pitch p1 can be formed by performing the operation of forming a groove-forming mask pattern just once.

Next, the first operation of forming a concave portion-forming mask pattern is performed in operations S15 through S18. In the first operation of forming a concave portion-forming mask pattern, a concave portion-forming mask pattern 105b which has a third pitch p3 is formed of the first hard mask layer 105. The concave portion-forming mask pattern 105b is used as a mask when forming an electrode (a via electrode 115) that is formed between the first wiring 102 and the second wiring 114 formed inside the groove (trench) 104b and connects the first wiring 102 and the second wiring 114.

Figure 2B:
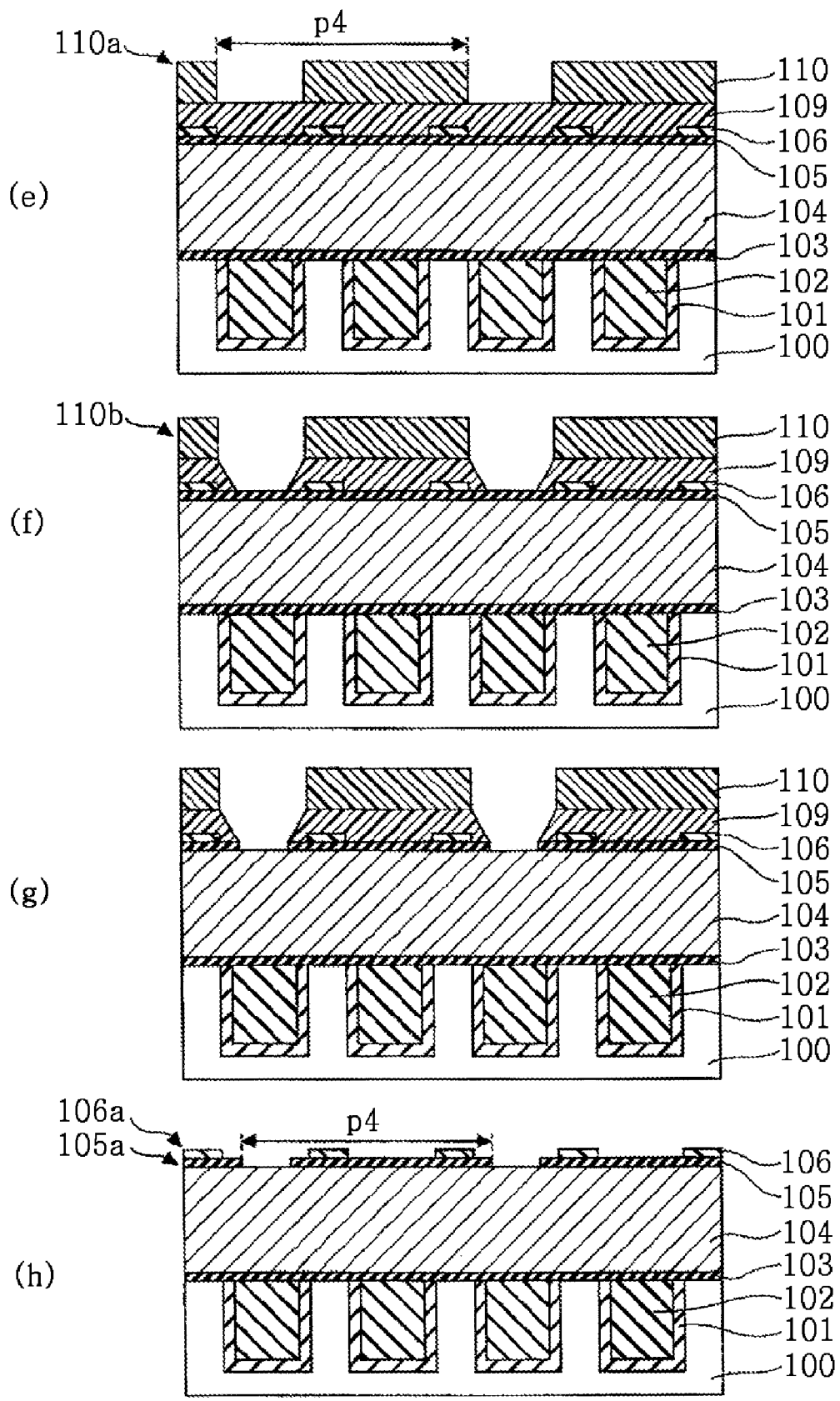

In operation S15, a first organic layer 109 and a second resist layer 110 are formed to form a pattern 110a with a fourth pitch p4 on the second resist layer 110. FIG. 2B(e) is a cross-sectional view illustrating the structure of the semiconductor substrate 100 after operation S15 is performed.

In operation S15, as illustrated in FIG. 2B(e), the first organic layer 109 and the second resist layer 110 are formed on the first hard mask layer 105 on which the groove-forming mask pattern 106a is formed, and then the pattern 110a that has the fourth pitch p4 is formed of the second resist layer 110 using a photolithography process.

Like the BARC layer 107, the first organic layer 109 may be formed of various organic materials such as amorphous carbon, polyphenol, or a photoresist. Also, a thickness of the first organic layer 109 may be, but is not limited to, for example, 50-200 nm.

The second resist layer 110 may be formed of, for example, an ArF resist. Also, a thickness of the second resist layer 110 may be, but is not limited to, 50-200 nm.

In operation S16, the pattern 110a is used as an etching mask to etch the first organic layer 109 in order to form a second resist pattern 110b. FIG. 2B(f) is a cross-sectional view illustrating the structure of the semiconductor substrate 100 after operation S16 is performed.

In operation S16, the pattern 110a that has the fourth pitch p4 and is formed of the second resist layer 110 as illustrated in FIG. 2B(e) is used as an etching mask to plasma-etch the first organic layer 109. In this plasma etching operation, a sidewall surface of an opening portion of the first organic layer 109 is plasma-etched in a tapered shape, and an etching gas used here may be $CF_4/CHF_3/Ar$. In this plasma etching operation, a reactant product is attached to the sidewall of the opening portion of the first organic layer 109 to etch the sidewall in a depth direction, and accordingly, the sidewall surface of the opening portion of the first organic layer 109 is tapered. Accordingly, a size (a bottom critical dimension (CD)) of the opening portion of the first organic layer 109 may be smaller than a size (a bottom CD) of an opening portion of the second resist layer 110.

As a result, as illustrated in FIG. 2B(f), the second resist pattern 110b comprising: the pattern 110a formed of the second resist layer 110; and the first organic layer 109 that has the opening portion which is connected to the opening portion of the second resist layer 110 and which is smaller than the opening portion of the second resist layer 110; may be formed.

In operation S17, the second resist pattern 110b is used as an etching mask to etch the first hard mask layer 105. FIG. 2B(g) is a cross-sectional view illustrating the structure of the semiconductor substrate 100 after operation S17 is performed.

In operation S17, the second resist pattern 110b formed of the second resist layer 110 and the first organic layer 109 illustrated in FIG. 2B(f) are used as an etching mask to etch the first hard mask layer 105 as illustrated in FIG. 2B(g). A mixed gas formed of $C_4F_8$, CO, $O_2$, and Ar may be used as an etching gas.

In operation S18, the second resist pattern 110b is removed. FIG. 2B(h) is a cross-sectional view illustrating the structure of the semiconductor substrate 100 after operation S18 is performed.

In operation S18, the second resist pattern 110b which is formed of the second resist layer 110 and the first organic layer 109, illustrated in FIG. 2B(f), is removed using, for example, an $O_2$ plasma ashing method. As the second resist pattern 110b is removed, as illustrated in FIG. 2B(h), a pattern 105a that has the fourth pitch p4 is formed of the first hard mask layer 105.

Also, according to the current embodiment, the third pitch p3 is equal to the first pitch p1. Also, the fourth pitch p4 is twice as large as the third pitch p3 or the first pitch p1. Thus, after the first operation of forming a concave portion-forming mask pattern, an opening portion of the first hard mask layer 105 is formed in the semiconductor substrate 100 to correspond to every other opening portion among all opening portions of the second hard mask layer 106.

Next, the second operation of forming a concave portion-forming mask pattern is performed in operations S19 through S22. The second operation of forming a concave portion-forming mask pattern is performed after the first operation of forming a concave portion-forming mask pattern, and here, an opening portion of the first hard mask layer 105 is formed to correspond to an opening portion of the second hard mask layer 106, to which the opening portion of the first hard mask layer 105 is not formed.

Figure 2C:
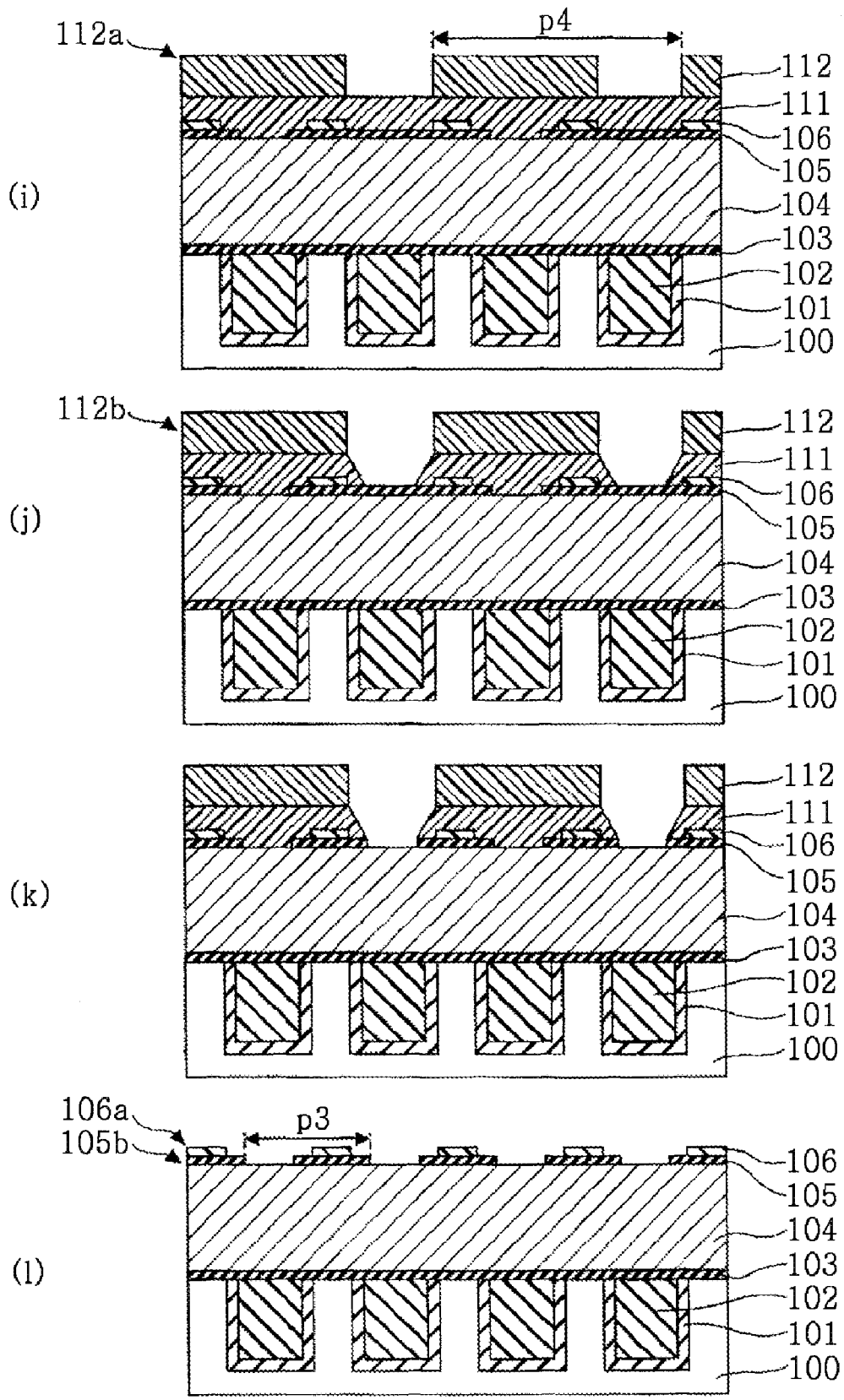
FIG. 2C illustrates third schematic cross-sectional views for explaining the method of manufacturing a semiconductor device of FIGS. 1A and 1B, and showing the structure of a minute pattern formed in each operation of the method.

In operation S19, a second organic layer 111 and a third resist layer 112 are formed to form a pattern 112a having the fourth pitch p4. FIG. 2C(i) is a cross-sectional view illustrating the semiconductor substrate 100 after operation S19 is performed.

Operation 19 is the same as operation S15 of the first operation of forming a concave portion-forming mask pattern. However, in operation S19, the pattern 112a is formed such that an opening portion is formed in the third resist layer 112 to correspond to an opening portion of the second hard mask layer 106, to which the opening portion of the first hard mask layer 105 is not formed, as illustrated in FIG. 2C(i).

Also, the material and thickness of the second organic layer 111 and the third resist layer 112 may be the same as in operation S15.

In operation S20, the pattern 112a is used as an etching mask to etch the second organic layer 111 in order to form a third resist pattern 112b. FIG. 2C(j) is a cross-sectional view illustrating the structure of the semiconductor substrate 100 after operation S20 is performed.

Like in operation S16, in operation S20, the pattern 112a illustrated in FIG. 2C(i) that has the fourth pitch p4 and is formed of the third resist layer 112 is used as an etching mask in order to etch the second organic layer 111 and plasma-etch a sidewall surface of the second organic layer 111 in a tapered shape. As a result, as illustrated in FIG. 2C(j), third resist pattern 112b comprising: the pattern 112a formed of the third resist layer 112; and the second organic layer 111 that has an opening portion which is connected to the opening portion of the third resist layer 112 and has a smaller size than that of the opening portion of the third resist layer 112; may be formed.

In operation S21, the third resist pattern 112b is used as an etching mask to etch the first hard mask layer 105. FIG. 2C(k) is a cross-sectional view illustrating the structure of the semiconductor substrate 100 after operation S21 is performed.

Like in operation S17, in operation S21, the third resist pattern 112b formed of the third resist layer 112 and the second organic layer 111 illustrated in FIG. 2C(j) are used as an etching mask to etch the first hard mask layer 105 as illustrated in FIG. 2C(k).

In operation S22, the third resist pattern 112b is removed. FIG. 2C(l) is a cross-sectional view illustrating the structure of the semiconductor substrate 100 after operation S22 is performed.

Like in operation S18, in operation S22, the third resist pattern 112b formed of the third resist layer 112 and the second organic layer 111 illustrated in FIG. 2C(j) are removed using, for example, an $O_2$ plasma ashing method. As the third resist pattern 112b is removed, a concave-forming mask pattern 105b that has the third pitch p3 is formed of the first hard mask layer 105 as illustrated in FIG. 2C(l).

Also, according to the current embodiment, the third pitch p3 is identical to the first pitch p1. Also, the fourth pitch p4 is twice as large as the third pitch p3 or the first pitch p1. Thus, after the second operation of forming a concave portion-forming mask pattern, an opening portion of the first hard mask layer 105 is formed to correspond to every opening portion among all opening portions of the second hard mask layer 106 in the semiconductor substrate 100.

Figure 2D:
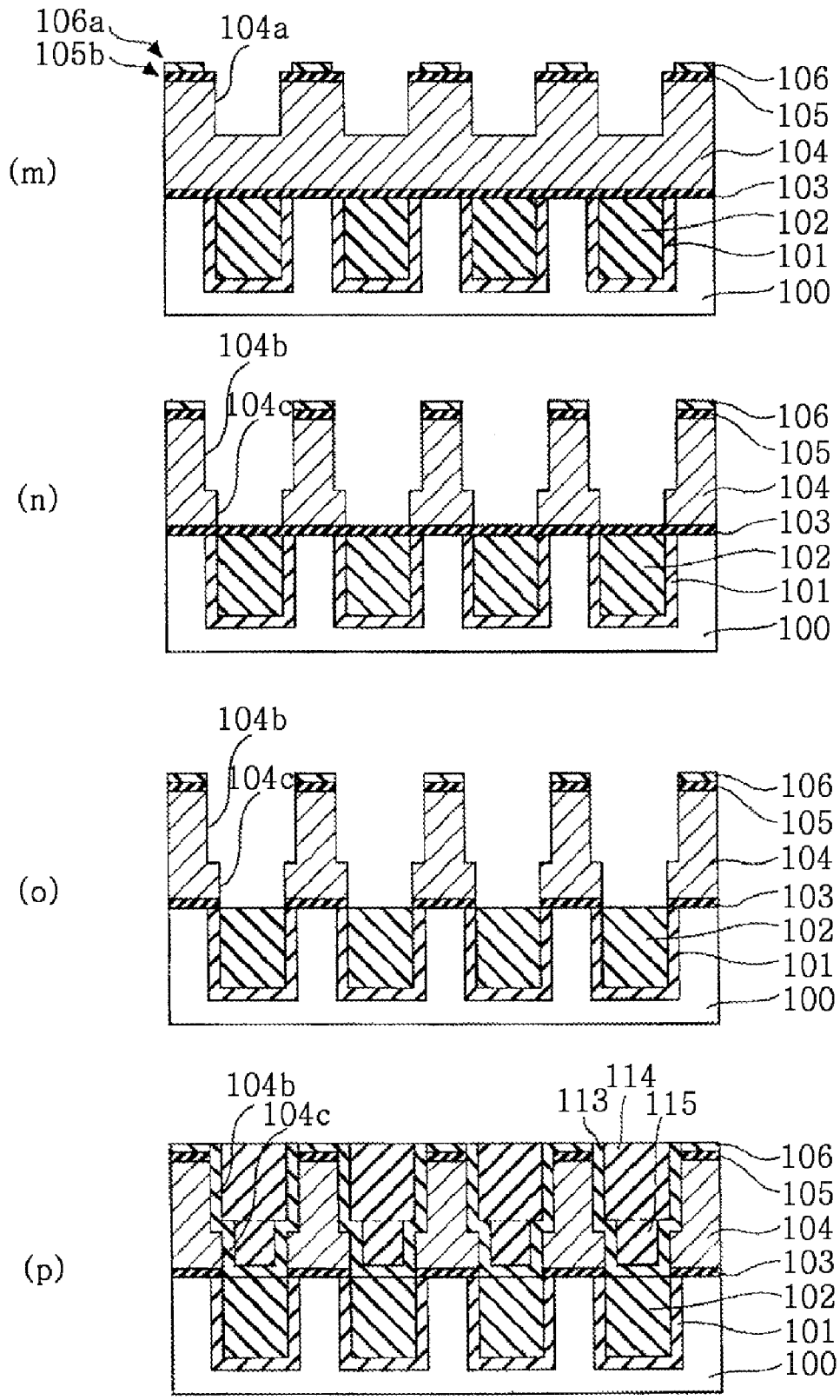
FIG. 2D illustrates fourth schematic cross-sectional views for explaining the method of manufacturing a semiconductor device of FIGS. 1A and 1B, and showing the structure of a minute pattern formed in each operation of the method.

Next, the operation of forming a groove and a concave portion is performed in operations S23 through S25. A groove (trench) 104b as illustrated in FIG. 2D(o) is formed by etching the insulation layer (the layer to be etched) 104, and a concave portion (hole or via) 104c on which an electrode (a via electrode) 115 which is formed between the first wiring 102 and the groove (trench) 104b and connects the first wiring 102 and the second wiring 114 is formed.

In operation S23, the concave portion-forming mask pattern 105b is used as an etching mask to etch the insulation layer (the layer to be etched) 104. In operation S23, as illustrated in FIG. 2D(m), the concave portion-forming mask pattern 105b which has an opening having a smaller size than an opening portion of the groove-forming mask pattern 106b and is formed on the first hard mask layer 105 is used as an etching mask to etch the insulation layer (the layer to be etched) 104.

When the insulation layer (the layer to be etched) 104 is formed of a SiCOH layer, the insulation layer (the layer to be etched) 104 may be plasma-etched. The conditions for plasma-etching of the SiCOH layer may be, but are not limited to, use of a gas such as $CF_4$ gas, $O_2$ gas, or Ar gas that is supplied to a treatment container from a gas supply source using a plasma etching apparatus, which is to be described later, maintaining a pressure in the treatment container at 6.7 Pa (50 mTorr) or less, supplying a first high frequency power of 1000 W at 600 MHz to an upper electrode, and plasmatizing the treatment gas. In addition, for example, a second frequency power of 300 W at 13.56 MHz is supplied for a bias to a lower electrode. Plasma in this case contains an active species of a compound of carbon and fluorine, and when the SiCOH layer is exposed in an atmosphere of the active species of the compound of carbon and fluorine, the active species reacts with one type of atoms in the SiCOH layer and produces a compound. Consequently, the insulation layer (the layer to be etched) 104 formed of the SiCOH layer is etched and a concave portion 104a is formed.

In operation S24, the concave-forming mask pattern 105b is used as an etching mask to etch the first hard mask layer 105 and the insulation layer (the layer to be etched) 104. In operation S14, the groove-forming mask pattern 106a illustrated in FIG. 2D(m) which has an opening portion that is larger than an opening portion of the concave portion-forming mask pattern 105b and which is formed of the second hard mask layer 106 is used as an etching mask to etch the first hard mask layer 105 and the insulation layer (the layer to be etched) 104.

In operation S24, the insulation layer 104 may be plasma-etched as in operation S23. The conditions for the plasma-etching may be, but are not limited thereto, use of a gas such as $CF_4$ gas, $O_2$ gas, or Ar gas that is supplied to a treatment container from a gas supply source using a plasma etching apparatus, which is to be described later, maintaining a pressure in the treatment container at 6.7 Pa (50 mTorr) or less, and supplying a first high frequency power of 1000 W at 600 MHz to an upper electrode, and plasmatizing the treatment gas. In addition, for example, a second high frequency power of 300 W at 13.56 MHz is supplied for a bias to a lower electrode. Plasma in this case contains an active species of a compound of carbon and fluorine, and when the active species reach a SiC layer or a SiCOH layer, the active species reacts to one type of atoms in the SiC layer or SiCOH layer and produces a compound. Consequently, as the first hard mask layer 105 formed of the SiC layer and the insulation layer 104 formed of the SiCOH layer are etched, a groove 104b as illustrated in FIG. 2D(n) is formed, and also, as the concave portion 104a formed in operation S23 is etched, a concave portion 104c is formed.

In operation S25, the etching stop layer 103 is etched to expose the first wiring 102. In operation S25, the etching stop layer 103 is etched to correspond to the opening portion of the concave portion 104c and the first wiring 102 is exposed as shown in FIG. 2D(o).

Next, the barrier metal layer 113 formed of tantalum (Ta) is formed using a sputtering method, and a seed layer (not shown) formed of Cu is deposited using the sputtering method. Also, the second wiring 114 formed of Cu and an electrode (a via electrode) 115 are formed using a plating method, and the second wiring 114 and the barrier metal layer 113 formed of Ta are polished and removed using a colloidal-silica slurry so that the second wiring 114 and the barrier metal layer 113 formed of Ta are planarized. Thus, a second wiring layer is formed. FIG. 2D(p) is a cross-sectional view illustrating the structure of the semiconductor substrate 100 after the second wiring layer is formed.

Next, the etching apparatus used in the method of manufacturing a semiconductor device according to the embodiment of FIGS. 1A and 1B will be described.

Figure 3:
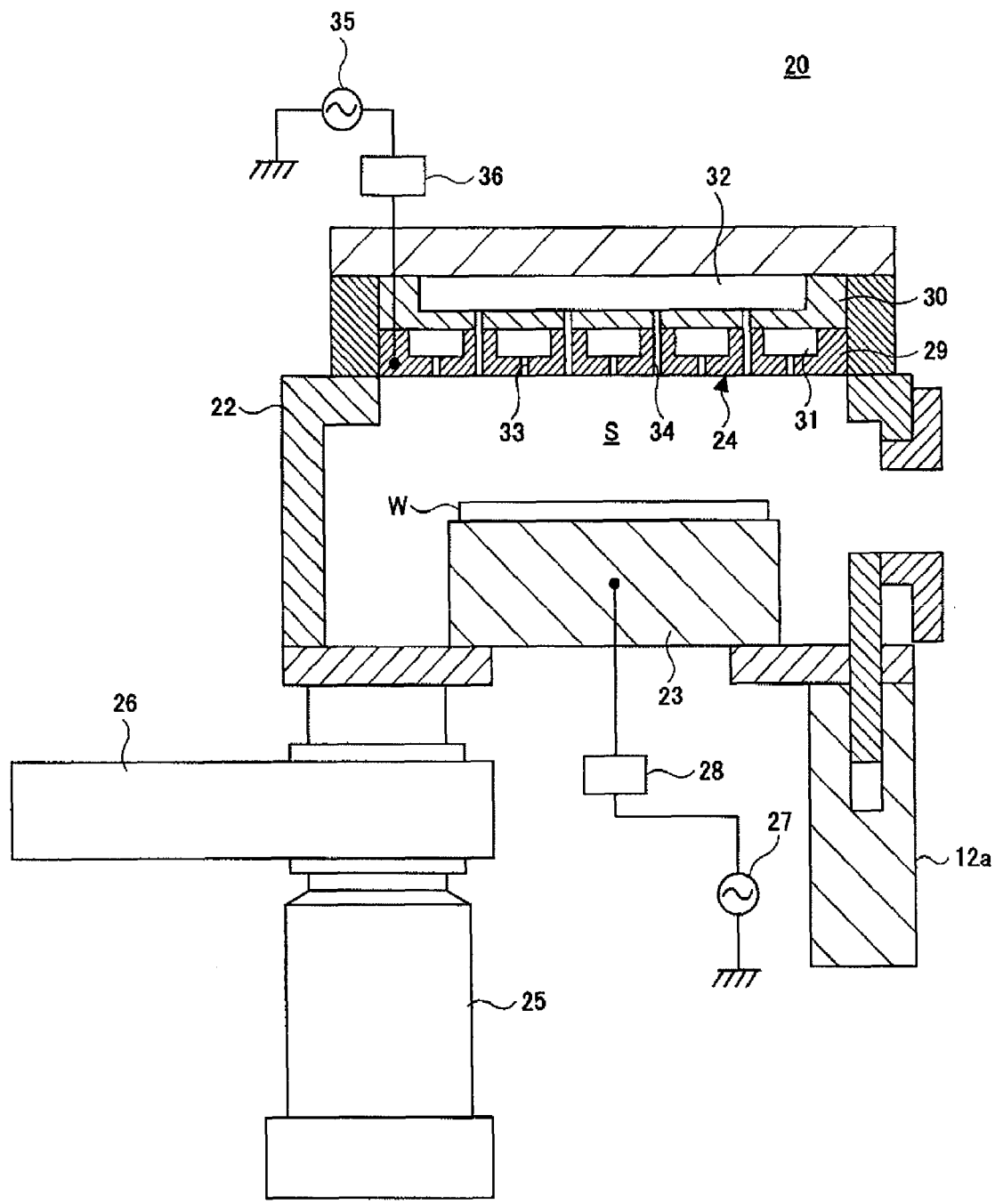
FIG. 3 is a vertical cross-sectional view illustrating an etching apparatus used in the method of manufacturing a semiconductor device of FIGS. 1A and 1B.

FIG. 3 is a vertical cross-sectional view illustrating an etching apparatus 20 used in the method of manufacturing a semiconductor device according to the current embodiment of the present invention, the method including an etching process.

Referring to FIG. 3, the etching apparatus 20 includes a treatment container (chamber) 22, a loading table 23 for loading a wafer W that is disposed in the chamber 22, a shower head 23 disposed in an upper portion of the chamber 22 and faces the loading table 23, a turbo molecular pump (TMP) 23 discharging gas from the chamber 22, and an adaptive pressure control (APC) valve 26, which is a variable butterfly valve and is disposed between the chamber 22 and the TMP 25 and controls a pressure in the chamber 22.

A high frequency power source 27 is connected to the loading table 23 via a matcher 28 and supplies high frequency power to the loading table 23. Accordingly, the loading table 23 functions as a lower electrode. Also, the matcher 28 reduces reflection of the high frequency power from the loading table 23 so as to maximize the supply efficiency of the high frequency power to the loading table 23. The loading table 23 applies the high frequency power supplied from the high frequency power source 27 to a treatment space S.

The shower head 24 comprises a disk-shaped lower gas supply unit 29 and a disk-shaped upper gas supply unit 30, wherein the lower gas supply unit 29 is overlapped on the upper gas supply unit 30. Also, the lower gas supply unit 29 and the upper gas supply unit 30 have a first buffer chamber 31 and a second buffer chamber 32, respectively. The first and second buffer chambers 31 and 32 are connected to the chamber 22 via gas through holes 33 and 34, respectively.

Also, a high frequency power source 35 is connected to the shower head 24 via a matcher 36, and the high frequency power source 35 supplies high frequency power to the shower head 24. Accordingly, the shower head 24 functions as an upper electrode. Also, the matcher 36 has the same function as the matcher 28. The shower head 24 applies high frequency power, which is supplied from the high frequency power source 35, to the treatment space S.

As described above, the loading table 23 and the shower head 24 apply high frequency power to the treatment space S in the chamber 22 of the etching apparatus 20, and thus a high density plasma is used as a treatment gas supplied from the shower head 24 to the treatment space S to generate ions or radicals so as to etch the wafer W.

Also, a finish point detecting apparatus (not shown), which has an electronic microscope for detecting a finish point of etching of the wafer W by observing the wafer W placed on the loading table 23 from the above, is installed in the shower head 24.

The first buffer chamber 31 is connected to an oxygen-containing gas supply system (not shown), which is a gas supply system for removing a resist using an $O_2$ plasma ashing method. The oxygen-containing gas supply system supplies oxygen-containing gas to the first buffer chamber 31. The supplied oxygen-containing gas is supplied to the chamber 22 via the gas through hole 33. Also, the second buffer chamber 32 is connected to an inactive gas supply system (not shown). The inactive gas supply system supplies an inactive gas to the second buffer chamber 32. The supplied inactive gas is supplied into the chamber 22 via the gas through hole 34.

Also, the first buffer chamber 31 is connected to a fluorocarbon gas supply system (not shown), which is an etching gas supply system for etching a SiCOH layer. The fluorocarbon gas supply system supplies fluorocarbon gas to the first buffer chamber 31. The supplied fluorocarbon gas is supplied to the chamber 22 through the gas through hole 33. Also, the second buffer chamber 32 is connected to a halogen-containing gas supply system (not shown). The halogen-containing gas supply system supplies halogen-containing gas to the second buffer chamber 32. The supplied halogen-containing gas is supplied to the chamber 22 through the gas through hole 34.

Also, according to the current embodiment, a substrate treatment system may be formed by placing a plurality of chambers, transfer modules, gate valves, etc., and combining a loader module, a load lock module, a wafer loading table, or a hoop, etc., (not shown) therewith. Each of the modules may be controlled by an operator using an operation panel including a display unit formed of a liquid crystal display (LCD) (not shown).

Next, the effect of forming the CDs of minute grooves (trenches) and concave portions (holes or vias) with high accuracy below a predetermined resolution limit by using the method of manufacturing a semiconductor device according to the current embodiment of the present invention will be described.

First, according to the current embodiment, in the first and second operations of forming a concave portion-forming mask pattern, patterns having an opening portion that has the fourth pitch p4 may be formed as the second resist layer 110 and the third resist layer 112, respectively, and a sidewall surface of the opening portion having the fourth pitch p4 of the first organic layer 109 and the second organic layer 111 may be tapered. Accordingly, a pattern having an opening portion that has a smaller size than that of an opening portion formed in the second resist layer 110 and the third resist layer 112 can be formed in each of the first organic layer 109 and the second organic layer 111, and thus a highly precise concave portion (hole or via) having a CD value with high accuracy below a predetermined resolution limit can be formed.

Also, as described above, according to the current embodiment, the operation of forming a concave portion-forming mask pattern is repeated twice using a mask having the fourth pitch p4 which is twice as large as the third pitch p3 so that the second resist pattern 110b and the third resist pattern 112b formed in each of the operations are formed such that the opening portion formed in the second resist pattern 110b is alternately disposed between the opening portions formed in the third resist pattern 112b. As a result, the concave portion-forming mask pattern 105b formed of an opening portion having the third pitch p3 may be formed. Consequently, the concave portion-forming mask pattern 105b having a pitch of 45 nm can be formed, for example, using a mask having a pitch of 90 nm, and thus a groove having a pitch below a predetermined resolution limit can be formed.

Figure 10:
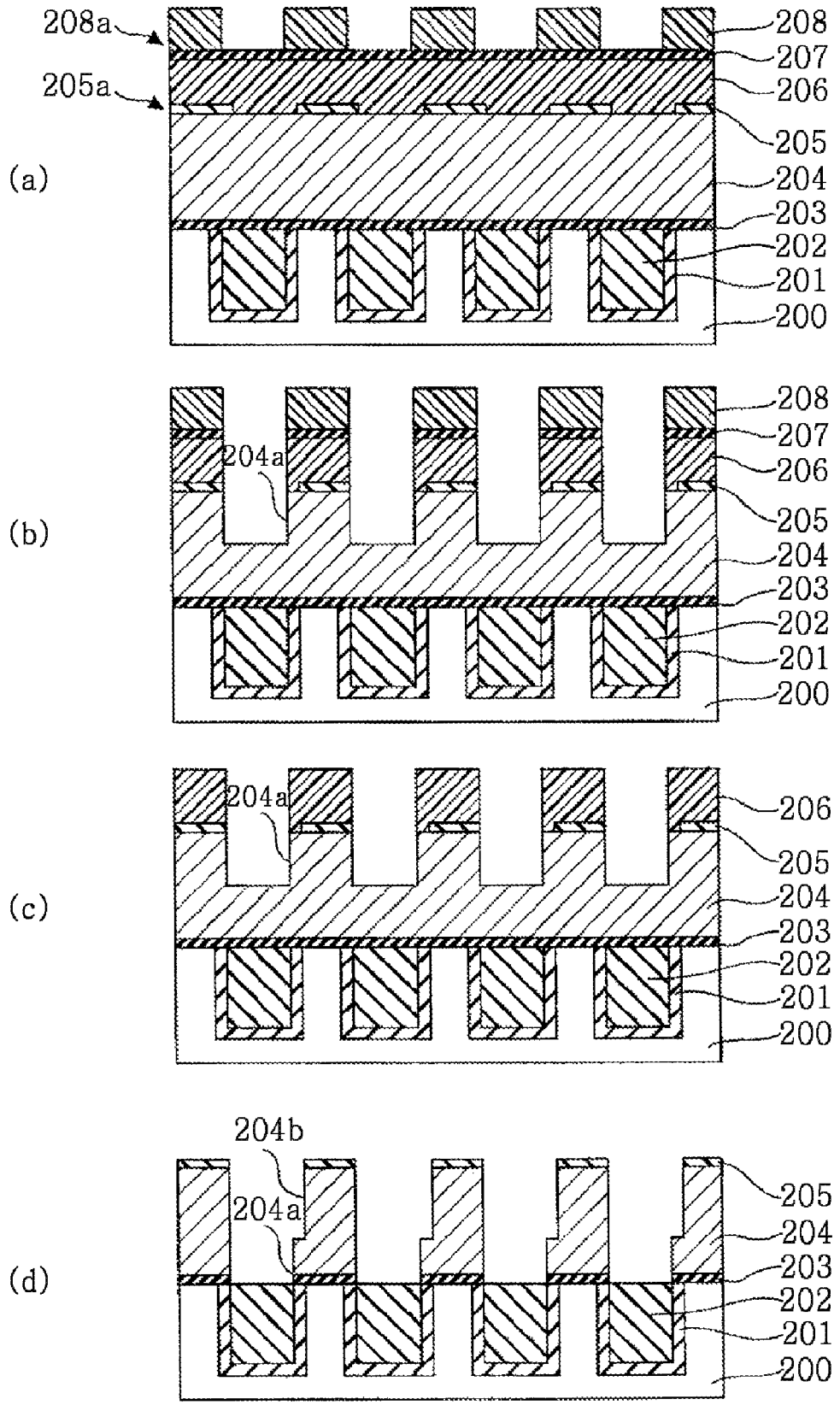
FIG. 10 is a schematic view for explaining a conventional method of manufacturing a semiconductor device.

Also, since two hard mask layers are formed, each of the hard mask layers may be processed into a mask pattern for forming a groove (trench) and a mask pattern for forming a concave portion (hole or via). Here, comparison with the conventional art where one hard mask layer is formed will be described with reference to FIG. 10. FIG. 10 illustrates schematic views for explaining a conventional method of manufacturing a semiconductor device. Referring to FIG. 10(a), a semiconductor substrate 200 is formed, on which a first wiring 202 is formed in advance using a barrier metal layer 201, and a SiC layer 203, a low-k layer 204, a TiN layer 205 having a pattern, an organic layer 206, a $SiO_2$ layer 207, and a photoresist layer 208 are formed on the semiconductor substrate 200. As illustrated in FIG. 10(a), etching is performed using a pattern 205a of the TiN layer 205 and a pattern 208a of the photoresist layer 208, which cross each other, so as to transfer the pattern 208a of the photoresist layer 208 to form a pattern 204a such as a concave portion (hole or via) (FIG. 10(b)), and then the photoresist layer 208 and the $SiO_2$ layer 207 are removed (FIG. 10(c)). Then, the organic layer 206 and the low-k layer 204 are etched and the pattern 205a of the TiN layer is transferred to form a pattern 204b such as a groove (trench) (FIG. 10(d)).

In the conventional art in which one hard mask layer is used, the pattern 204a such as the concave portion (hole or via) is formed using the pattern 208a on the photoresist layer 208, and thus the low-k layer 204 is subjected to $O_2$ plasma between the operations of FIGS. 10(b) and 10(c), when the photoresist layer 208 and the organic layer 206 are removed using an ashing process while the low-k layer is exposed. As a result, deterioration of the characteristics and the shape, that is, plasma damage, is generated; in particular, if shape deterioration is generated, a CD of the grooves and concave portions is out of a desired CD range.

However, according to the current embodiment of the present invention, two hard mask layers are used respectively to form mask patterns for forming a groove (trench) and a concave portion (hole or via), and thus the ashing process for removing a resist can be completed before etching the insulation layer (the layer to be etched). Accordingly, an ashing process needs not be performed after the etching of the insulation layer (the layer to be etched), and thus plasma damage is not generated in the insulation layer (layer to be etched), and furthermore a CD of the grooves and concave portions can be precisely adjusted.

Also, according to the current embodiment, in the first operation of forming a concave portion-forming mask pattern, the second resist pattern is used as an etching mask to etch the first hard mask layer and then the second resist pattern is removed. Accordingly, in the second operation of forming a concave portion-forming mask pattern, the third resist pattern is used as an etching mask to form an opening portion in a pattern formed in the first hard mask layer during the first operation of forming a concave portion-forming mask pattern. Thus, in a dual damascene method in which a groove (trench) and a concave portion (hole or via) are formed at the same time, minute patterns below a predetermined resolution limit can be formed using only an LLE process.

Next, conditions for plasma etching of the sidewall surface of the first organic layer 109 in a tapered form in operation S16 will be described with reference to the Examples below.

According to Example 1, the etching apparatus 20 illustrated in FIG. 3 was used to plasma-etch the first organic layer 109 under the following conditions, such that the structures as illustrated in FIGS. 2B(e) through 2B(f) are formed:

Etching gas: $CF_4/CHF_3/Ar=50/50/200$ sccm
Pressure: 13.3 Pa(100 mTorr)
Distance between electrodes: 35 mm
Temperature (lower portion/upper portion/sidewall portion)=30/30/50° C.
Helium pressure for cooling (center portion/peripheral portion)=1330/4655 Pa(10/35 Torr)
Time: 70 seconds As a result, while a size (a bottom CD) of an opening portion of the pattern 110a formed of the second resist layer 110 was 135 nm, a size (a bottom CD) of an opening portion of the first organic layer 109 was 118 nm in a wafer center portion and 122 nm in a wafer peripheral portion. Also, a cross-section of the opening portion of the first organic layer 109 was observed using the electronic microscope and a sidewall portion of the opening portion of the first organic layer 109 was tapered. Accordingly, the size of the opening portion 109 can be reduced to be smaller than the size of the opening portion of the pattern 110a formed of the second resist layer 110. That is, a small-diameter hole smaller than a pattern aperture of the pattern 110a or a groove narrower than a width of the opening portion of the pattern 110a may be formed.

In Example 2, the first organic layer 109 was plasma-etched under the same etching conditions as in Example 1 except that the power supplied to the upper electrode was increased to 1000 W. As a result, while a size (a bottom CD) of an opening portion of the pattern 110a formed of the second resist layer 110 was 135 nm, a bottom CD of an opening portion of the first organic layer 109 was 112 nm in a wafer center portion and 112 nm in a wafer peripheral portion. Also, a cross-section of the opening portion of the first organic layer 109 was observed using the electronic microscope, and a sidewall portion of the opening portion of the first organic layer 109 was tapered.

In Example 3, the first organic layer 109 was plasma-etched under the same etching conditions as in Example 1 except that the power supplied to the upper electrode was increased to 1500 W. As a result, while a size (a bottom CD) of an opening portion of the pattern 110a formed of the second resist layer 110 was 135 nm, a size (a bottom CD) of an opening portion of the first organic layer 109 was 100 nm in a wafer center portion and 98 nm in a wafer peripheral portion. Also, a cross-section of the opening portion of the first organic layer 109 was observed using the electronic microscope, and a sidewall portion of the opening portion of the first organic layer 109 was tapered.

Next, in Examples 4 and 5, the first organic layer 109 was plasma-etched under the same etching conditions as in Example 1 except that a flow amount ratio of $CF_4$ to $CHF_3$ in the etching gas $CF_4/CHF_3/Ar$, which was 50/50 in Example 1, was modified to 35/65 in Example 4 and to 20/80 in Example 5. As a result, while a size (bottom CD) of an opening portion of the pattern 110a formed of the second resist layer 110 was 135 nm, a size (a bottom CD) of an opening portion of the first organic layer 109 in Example 4 was 120 nm in a wafer center portion and 118 nm in a wafer peripheral portion, and a size (a bottom CD) of an opening portion of the first organic layer 109 in Example 5 was 112 nm in a wafer center portion and 112 nm in a wafer peripheral portion. As can be seen from Examples 4 and 5, the size (bottom CD) of the opening portion of the first organic layer 109 can be further reduced by reducing the flow amount of $CF_4$ in the etching gas $CF_4$/$CHF_3$. As described above, the size (bottom CD) of the opening portion of the first organic layer 109 can be adjusted by modifying the flow amount ratio of $CF_4$ and $CHF_3$.

Next, in Examples 6 and 7, the first organic layer 109 was plasma-etched under the same etching conditions as in Example 1 except that the pressure for plasma-etching in Example 1, which was 13.3 Pa, was modified to 6.65 Pa in Example 6 and to 4.4 Pa in Example 7. As a result, while a size (a bottom CD) of an opening portion of the pattern 110a formed of the second resist layer 110 was 135 nm, a size (a bottom CD) of an opening portion of the first organic layer 109 in Example 4 was 115 nm in a wafer center portion, and 117 nm in a wafer peripheral portion, and a size (a bottom CD) of an opening portion of the first organic layer 109 in Example 5 was 118 nm in a wafer center portion and 120 nm in a wafer peripheral portion. As apparent from Examples 6 and 7, the same effect is obtained at least in a pressure range of 4.4-13.3 Pa, and a difference in the pressure hardly affects the size (the bottom CD) of the opening portion.

Also, in Example 8, the first organic layer 109 was plasma-etched under the same etching conditions as in Example 1 except that the etching time for plasma-etching, which was 70 seconds in Example 1, was modified to 50 seconds. As a result, while a size (a bottom CD) of an opening portion of the pattern 110a formed of the second resist layer 110 was 135 nm, a size (a bottom CD) of an opening portion of the first organic layer 109 in Example 4 was 132 nm in a wafer center portion and 132 nm in a wafer peripheral portion. As can be seen from Example 8, when the etching time is reduced, the size (the bottom CD) of the opening portion tends to increase. Accordingly, by modifying the etching time, the size (the bottom CD) of the opening portion can be adjusted.

As described above, according to the current embodiment of the present invention, two hard mask layers are used to respectively correspond to the groove-forming mask pattern and the concave portion-forming mask pattern, and thus damage to the insulation layer (layer to be etched) due to $O_2$ plasma ashing can be prevented. Also, in the operation of forming a concave portion-forming mask pattern, in which a concave portion-forming mask pattern (hole or via) is formed, an LLE process using a pattern having a tapered opening portion is applied to form a minute, concave portion-forming mask pattern. Consequently, when forming a pattern such as a groove (trench) and a pattern such as a concave portion (hole or via) below a predetermined resolution limit using a dual damascene method, a transfer accuracy of transferring the groove (trench) pattern and the concave portion (hole or via) pattern to the insulation layer (the layer to be etched) can be increased.

Also, according to the current embodiment of the present invention, a semiconductor device can be manufactured to include a groove, a concave portion which is formed at a bottom of the groove and has an opening portion that has a smaller size than an opening portion of the groove, a first wiring formed on a semiconductor substrate and under a layer to be etched, a second wiring formed in the groove, and an electrode (via electrode) formed in the concave portion and connecting the first and second wirings. However, the semiconductor device is not limited to inclusion of the first wiring, the second wiring, and the electrode (via electrode) connecting the first and second wirings, and also, a semiconductor including only a groove and a concave portion on a layer to be etched on a semiconductor substrate may be manufactured.

Second Embodiment

Next, a method of manufacturing a semiconductor device according to another embodiment of the present invention will be described with reference to FIGS. 4A through 5E.

Figure 4A:
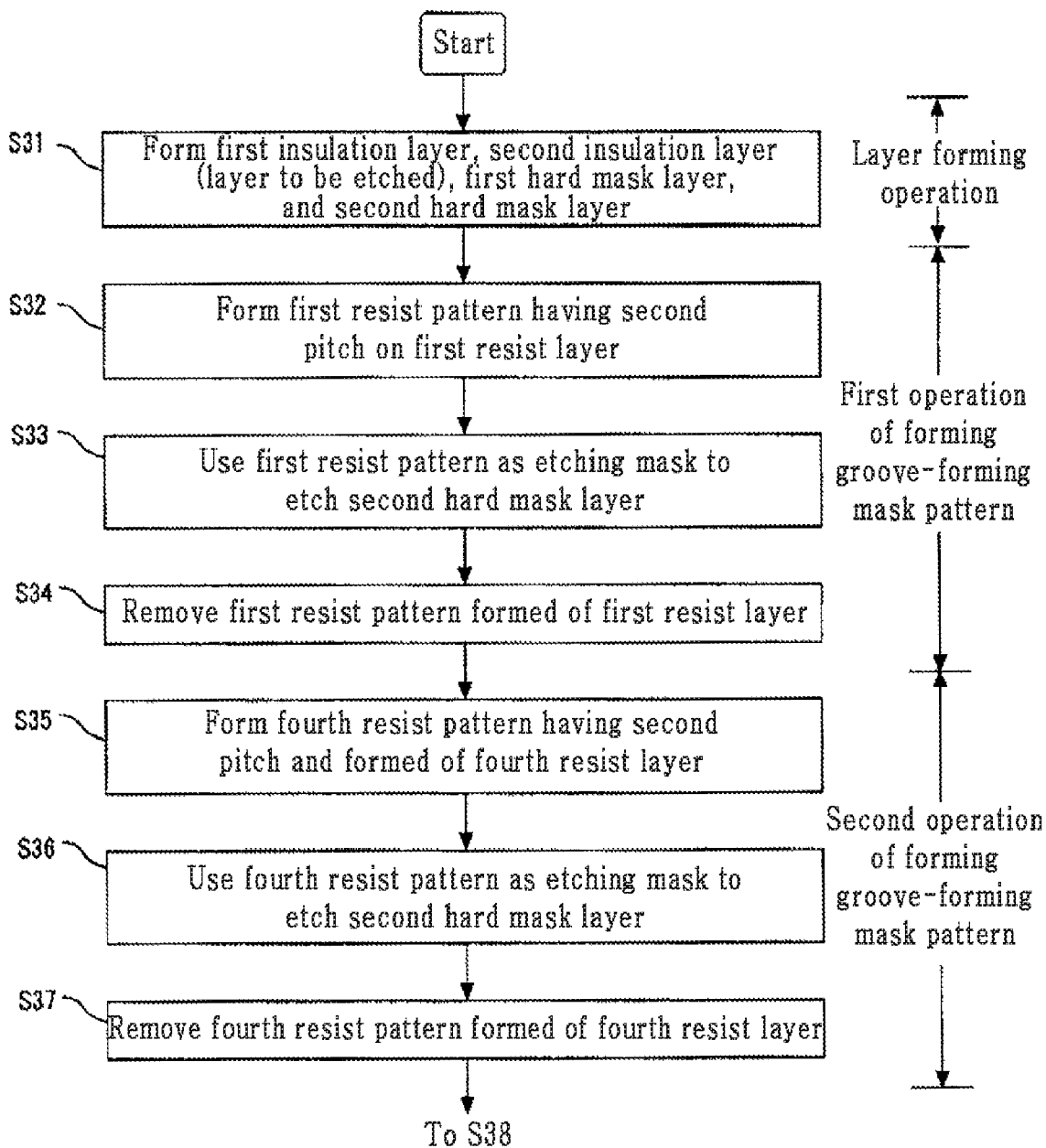
FIG. 4A is a first flowchart illustrating a method of manufacturing a semiconductor device according to other embodiment of the present invention.
Figure 4B:
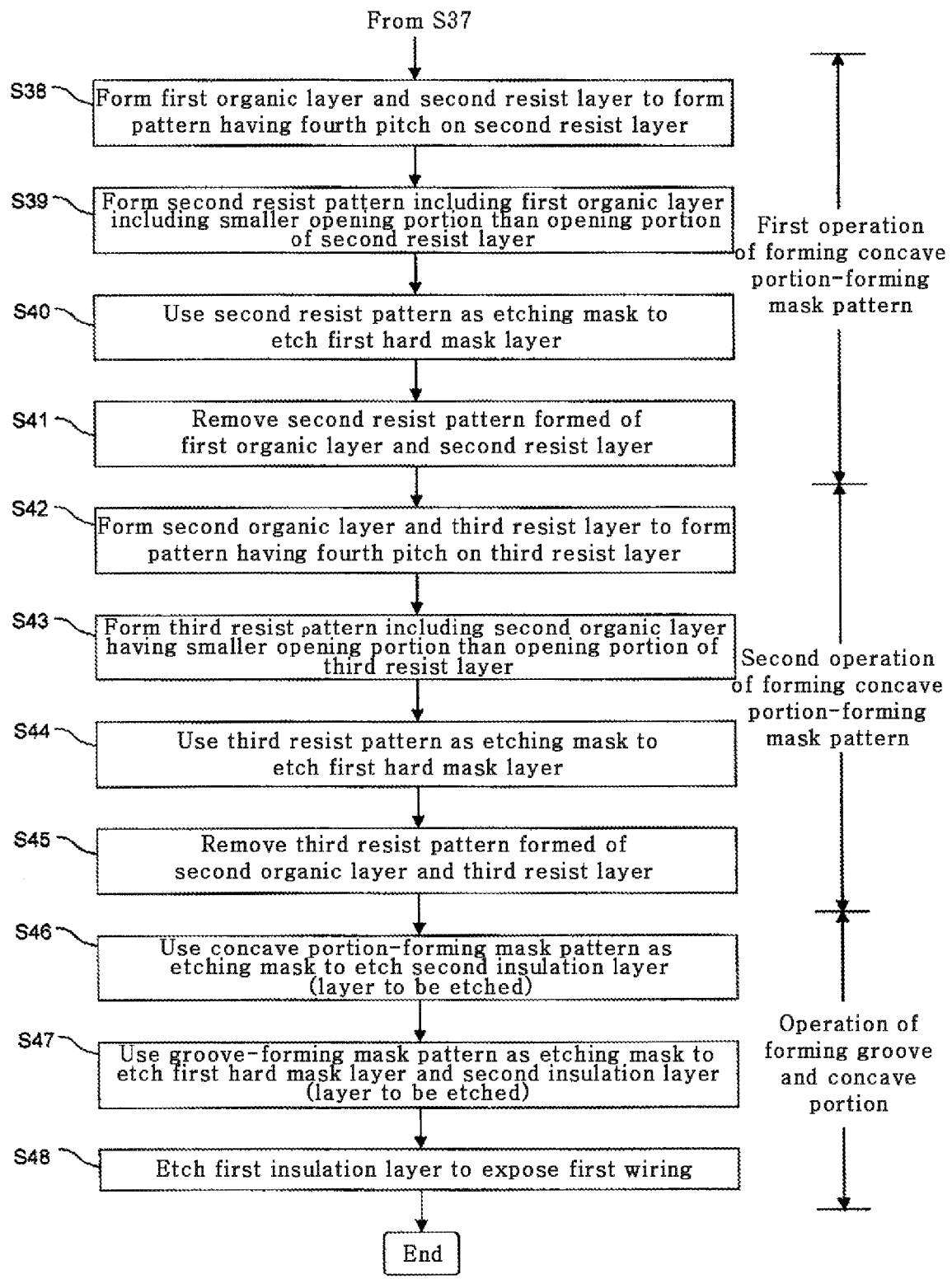
FIG. 4B is a second flowchart illustrating the method of manufacturing a semiconductor device according to the other embodiment of the present invention.

FIGS. 4A and 4B are flowcharts illustrating the method of manufacturing a semiconductor device according to another embodiment of the present invention. FIGS. 5A through 5E are cross-sectional views for explaining the method of manufacturing a semiconductor device of FIGS. 4A and 4B, and show minute patterns formed in each operation of the method. The minute patterns formed in operations S31 through S48 of FIGS. 4A and 4B correspond to the structures illustrated in the cross-sectional views of FIGS. 5A(a) through 5E(r), respectively. Also, FIG. 5E(s) is a cross-sectional view illustrating the structure of the minute patterns on which a second wiring is formed after the above operations are performed.

The method of manufacturing a semiconductor device according to the current embodiment is different from the previous embodiment in that an operation of forming a groove-forming mask pattern including first and second operations of forming a groove-forming mask pattern is performed twice.

That is, according to the method of manufacturing a semiconductor device according to the current embodiment, the LLE process in which a second resist pattern is formed between first resist patterns is performed both in the operation of forming a groove-forming mask pattern and the operation of forming a concave portion-forming mask pattern.

The method of manufacturing a semiconductor device according to the current embodiment of the present invention includes, as shown in FIGS. 4A and 4B, a layer forming operation, a first operation of forming a groove-forming mask pattern, a second operation of forming a groove-forming mask pattern, a first operation of forming a concave portion-forming mask pattern, a second operation of forming a concave portion-forming mask pattern, and an operation of forming a groove and a concave portion. The layer forming operation includes operation S31, the first operation of forming a groove-forming mask pattern includes operations S32 through S34, the second operation of forming a groove-forming mask pattern includes operations S35 through S37, the first operation of forming a concave portion-forming mask pattern includes operations S38 through S41, the second operation of forming a concave portion-forming mask pattern includes operations S42 through S45, and the operation of forming a groove and a concave portion includes operations S46 through S48.

In the method of manufacturing a semiconductor device according to the current embodiment, a semiconductor device including a first wiring formed on a semiconductor substrate, a second wiring formed above the first wiring, and an electrode (a via electrode) that is formed between the first and second wirings and connecting the first and second wirings is manufactured. The method further includes forming a groove (trench) and a concave portion (hole or via) for forming the second wiring and the electrode (via electrode) after the first wiring is formed.

According to the method of manufacturing a semiconductor device according to the current embodiment, a semiconductor substrate 120 on which a first wiring 122 is formed in advance is provided. Like in the embodiment of FIGS. 1A and 1B, a groove (trench) for forming a first wiring, which is coated with a barrier metal layer 121 on lateral and lower surfaces, is formed on the semiconductor substrate 120. Also, like the embodiment of FIGS. 1A and 1B, the first wiring 122 is formed to cover the groove (trench) for forming the first wiring 122.

Figure 5A:
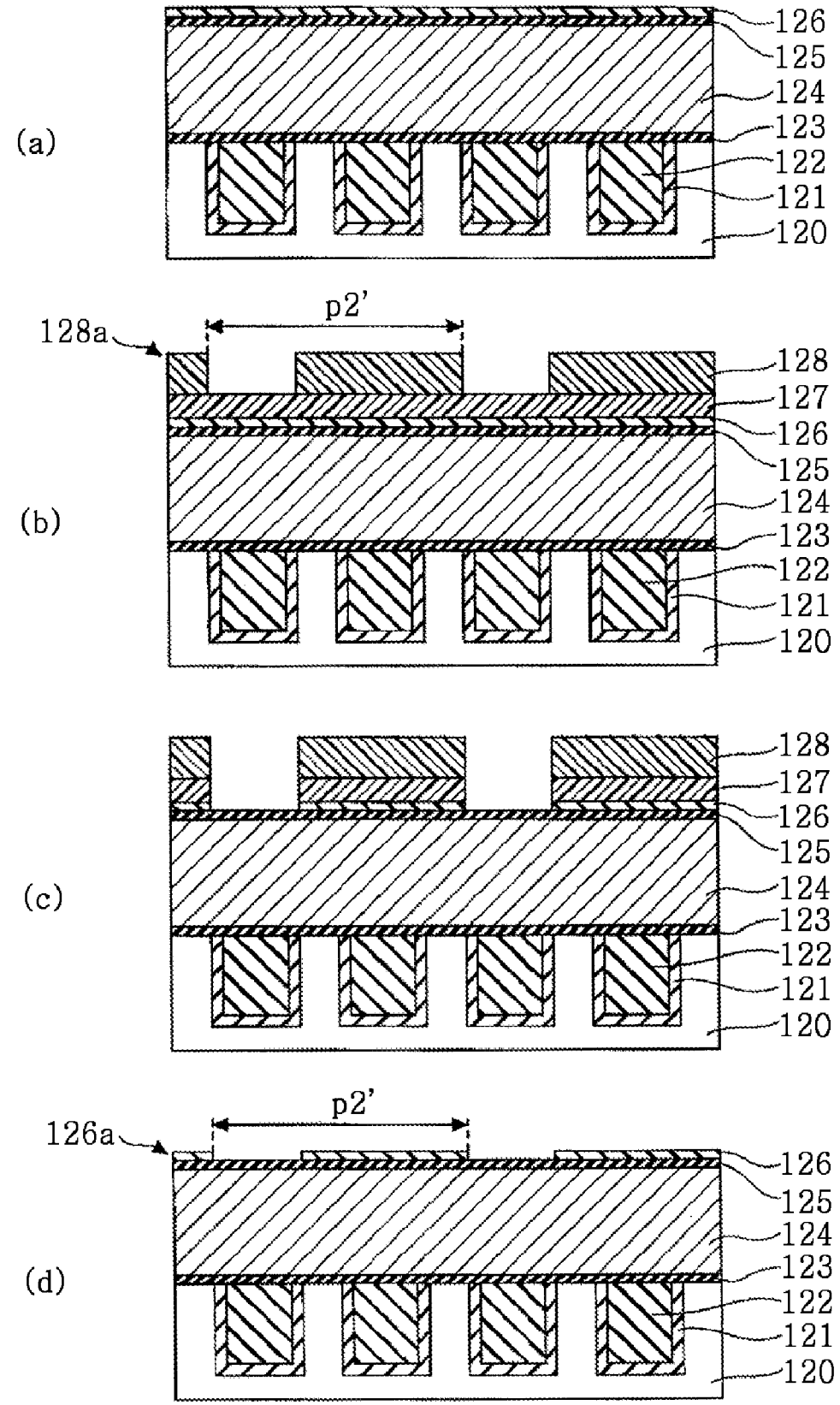
FIG. 5A illustrates first schematic cross-sectional views for explaining the method of manufacturing a semiconductor device of FIGS. 4A and 4B, and showing the structure of a minute pattern formed in each operation of the method.

First, a layer forming operation including operation S31 is performed. Operation S31 is a layer forming operation in which a first hard mask layer 125 and a second hard mask layer 126 are formed, which is the same as operation S11 of the embodiment of FIGS. 1A and 1B. FIG. 5A(a) is a cross-sectional view illustrating the structure of the semiconductor substrate 120 after operation S31 is performed.

In operation S31, as illustrated in FIG. 5A(a), the first wiring 122 is formed through the barrier metal layer 121, and an etching stop layer 123, an insulation layer (a layer to be etched) 124, a first hard mask layer 125, and a second hard mask layer 126 are sequentially formed to cover the planarized semiconductor substrate 120. The layers are formed in the same manner as in operation S11 of the embodiment of FIGS. 1A and 1B.

Next, the first operation of forming a groove-forming mask pattern is performed using operations S32 through S34. In the first operation of forming a groove-forming mask pattern, a groove-forming mask pattern 126a which has a first pitch p1 is formed of the second hard mask layer 126. The groove-forming mask pattern 126a is used as a mask when forming a pattern of a groove (trench) 124b illustrated in FIG. 5E(s).

In operation S32, a first resist pattern 128a, which has a second pitch p2' and is formed of a first resist layer 128 using a BARC layer 127, is formed, which is the same as operation S12 of the embodiment of FIGS. 1A and 1B. FIG. 5A(b) is a cross-sectional view illustrating the structure of the semiconductor substrate 120 after operation S32 is performed.

In operation S33, the first resist pattern 128a is used as an etching mask to etch the BARC layer 127 and the second hard mask layer 126, which is the same as operation S13 of the embodiment of FIGS. 1A and 1B. FIG. 5A(c) is a cross-sectional view illustrating the structure of the semiconductor substrate 120 after operation S32 is performed.

In operation S34, the first resist pattern 128a and the BARC layer 127 are removed, which is the same as operation S14 of the embodiment of FIGS. 1A and 1B. FIG. 5A(d) is a cross-sectional view illustrating the structure of the semiconductor substrate 120 after operation S34 is performed.

Also, in operation S34, when the first resist pattern 128a and the BARC layer 127 are removed using the $O_2$ plasma ashing method, since the insulation layer 124 is coated with the first hard mask layer 125, deterioration of the characteristics or the form of the insulation layer 124, which is formed of a low-k layer, is not generated.

Also, according to the current embodiment, the second pitch p2' is twice as large as the first pitch p1. Thus, as illustrated in FIG. 5A(d), a pattern formed of the second hard mask layer 126 in operation S34 is the pattern 126a in which each pattern of the groove-forming mask pattern 126b illustrated in FIG. 5B(g), which is to be formed at the first pitch p1, is formed at every other interval.

Next, the second operation of forming a groove-forming mask pattern is performed in operations S35 through S37. In the second operation of forming a groove-forming mask pattern, a pattern formed of the second hard mask layer 126 is formed again such that an opening portion is formed between opening portions of the pattern 126a which is formed in the first operation of forming a groove-forming mask pattern.

Figure 5B:
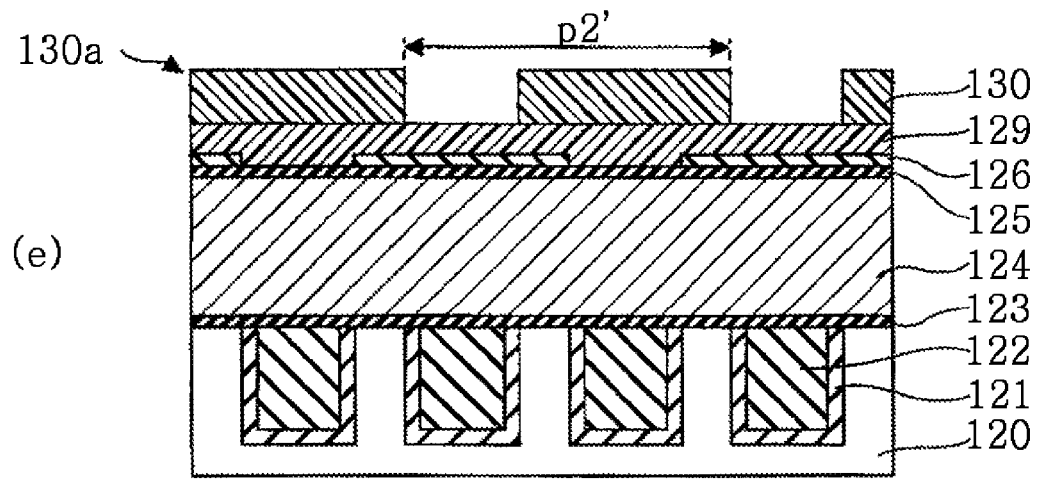
FIG. 5B illustrates second schematic cross-sectional views for explaining the method of manufacturing a semiconductor device of FIGS. 4A and 4B, and showing the structure of a minute pattern formed in each operation of the method.
Figure 5B:
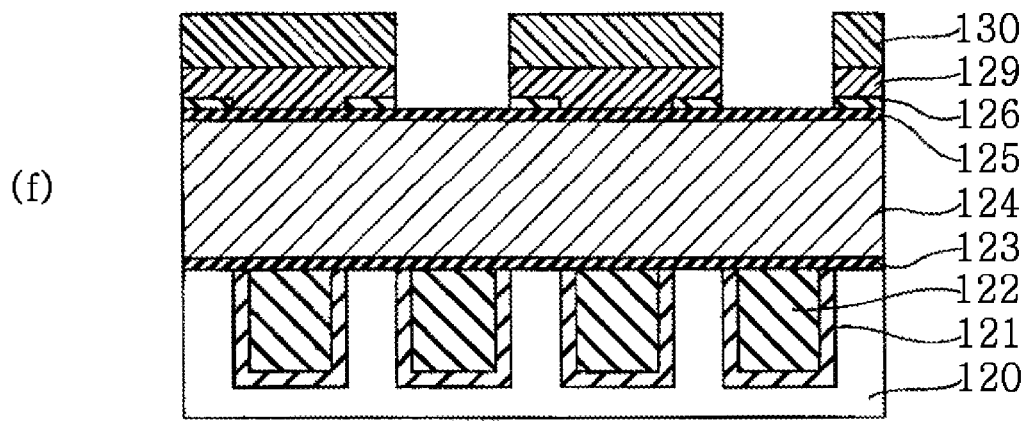
Figure 5B:
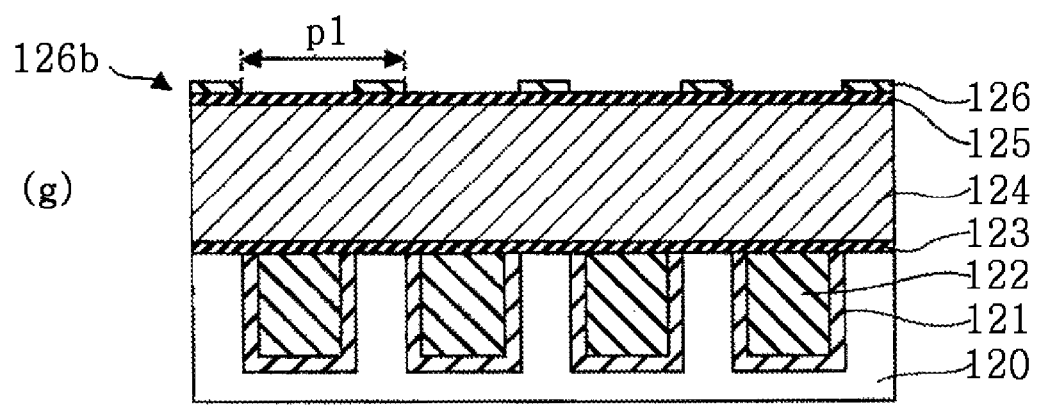

In operation S35, a fourth resist pattern 130a which has the second pitch p2' is formed of a fourth resist layer 130 using a BARC layer 129, which is the same as operation S32 of the first operation of forming a groove-forming mask pattern. FIG. 5B(e) is a cross-sectional view illustrating the structure of the semiconductor substrate 120 after operation S35 is performed.

In operation S36, the fourth resist pattern 130a is used as an etching mask to etch the BARC layer 129 and the second hard mask layer 126, which is the same as operation S33 of the first operation of forming a groove-forming mask pattern. FIG. 5B(f) is a cross-sectional view illustrating the structure of the semiconductor substrate 120 after operation S36 is performed.

In operation S37, the fourth resist pattern 130a and the BARC layer 129 are removed, which is the same as operation S34 of the first operation of forming a groove-forming mask pattern. FIG. 5B(g) is a cross-sectional view illustrating the structure of the semiconductor substrate 120 after operation S37 is performed.

Also, in operation S37, when the fourth resist pattern 130a and the BARC layer 129 are removed using the $O_2$ plasma ashing method, since the insulation layer 124 is coated with the first hard mask layer 125, deterioration of the characteristics or the form of the insulation layer 124, which is formed of a low-k layer, does not occur.

Since the second pitch p2' is twice as large as the first pitch p1, by performing the second operation of forming a groove-forming mask pattern, an opening portion may be formed between the opening portions of the pattern 126a which is formed in the first operation of forming a groove-forming mask pattern. Thus a groove-forming mask pattern 126b having the first pitch p1 may be formed. Accordingly, by performing the operation of forming a groove-forming mask pattern twice by using the mask having the second pitch p2' which is greater than a predetermined resolution limit, the groove-forming mask pattern 126b having the first pitch p1 below the predetermined resolution limit can be formed.

Figure 5C:
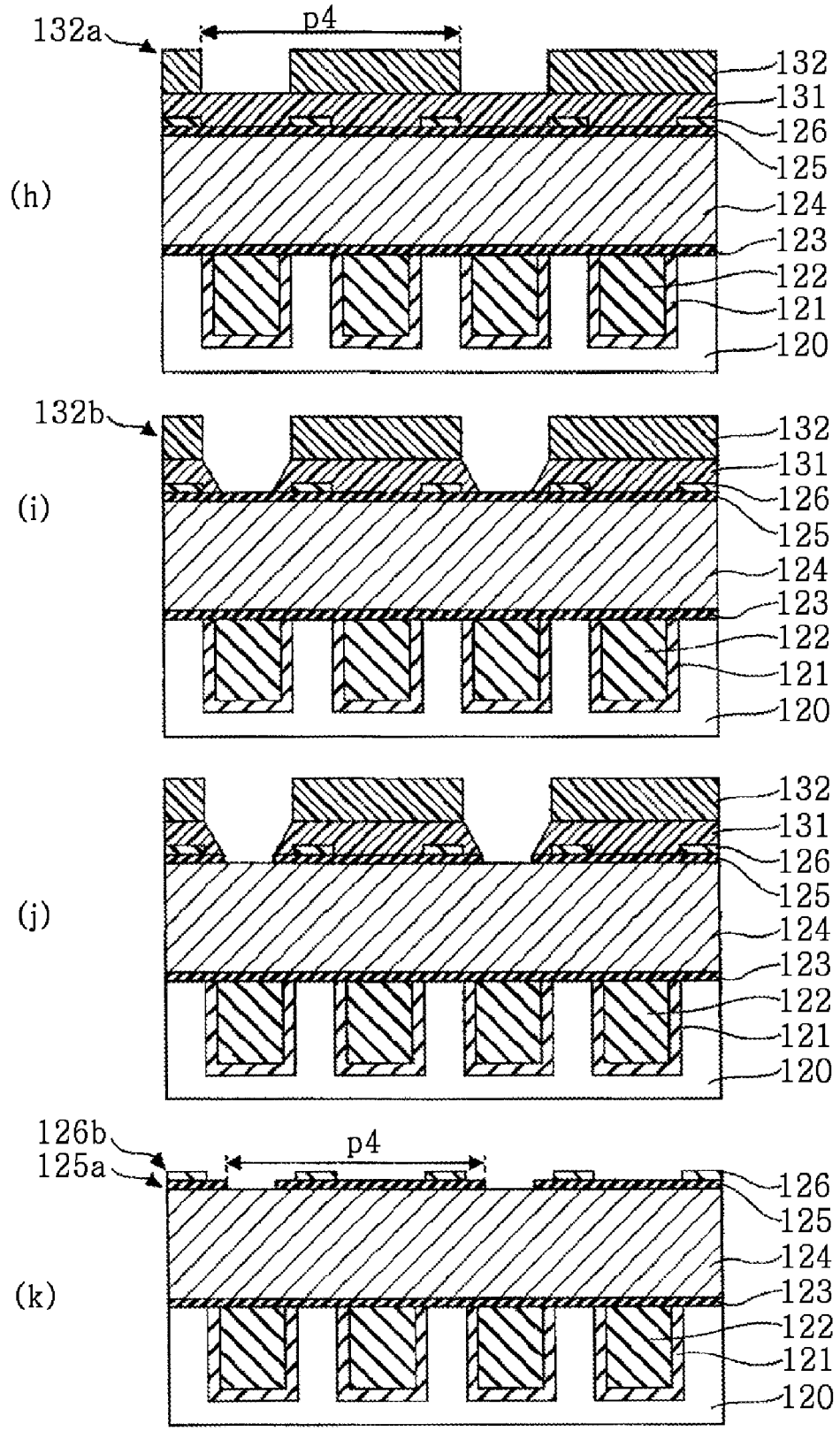
FIG. 5C illustrates third schematic cross-sectional views for explaining the method of manufacturing a semiconductor device of FIGS. 4A and 4B, and showing the structure of a minute pattern formed in each operation of the method.

Next, the first operation of forming a concave portion-forming mask pattern which is performed in operations S38 through S41 and the second operation of forming a concave portion-forming mask pattern is performed in operations S42 through S45. In the first and second operations of forming concave portion-forming mask patterns, a concave portion-forming mask pattern 125b, which has the third pitch p3, is formed of the first hard mask layer 125, and is used as a mask when forming a concave portion (hole or via) 124c on which an electrode (via electrode) 137 is formed, is formed. The electrode 137 is disposed between the first wiring 122 and the second wiring 136 illustrated in FIG. 5E(s) and connects the first wiring 122 and the second wiring 136. The first operation of forming a concave portion-forming mask pattern which is performed in operations S38 through S41 and the second operation of forming a concave portion-forming mask pattern which is performed in operations S42 through S45 are the same as the first operation of forming a concave portion-forming mask pattern performed in operations S15 through S18 and the second operation of forming a concave portion-forming mask pattern performed in operations S19 through S22 of the embodiment of FIGS. 1A and 1B. FIGS. 5C(h) through FIG. 5D(o) are cross-sectional views of the semiconductor substrate 120 after operations S38 through S45 are performed.

Also, in operation S39 and in operation S43, the conditions for plasma-etching sidewall surfaces of opening portions of a first organic layer 131 and a second organic layer 133 in a tapered shape may be the same as the conditions of the plasma-etching of the sidewall surface of the opening portion of the first organic layer 109 of operation S16 of the embodiment of FIGS. 1A and 1B.

Figure 5D:
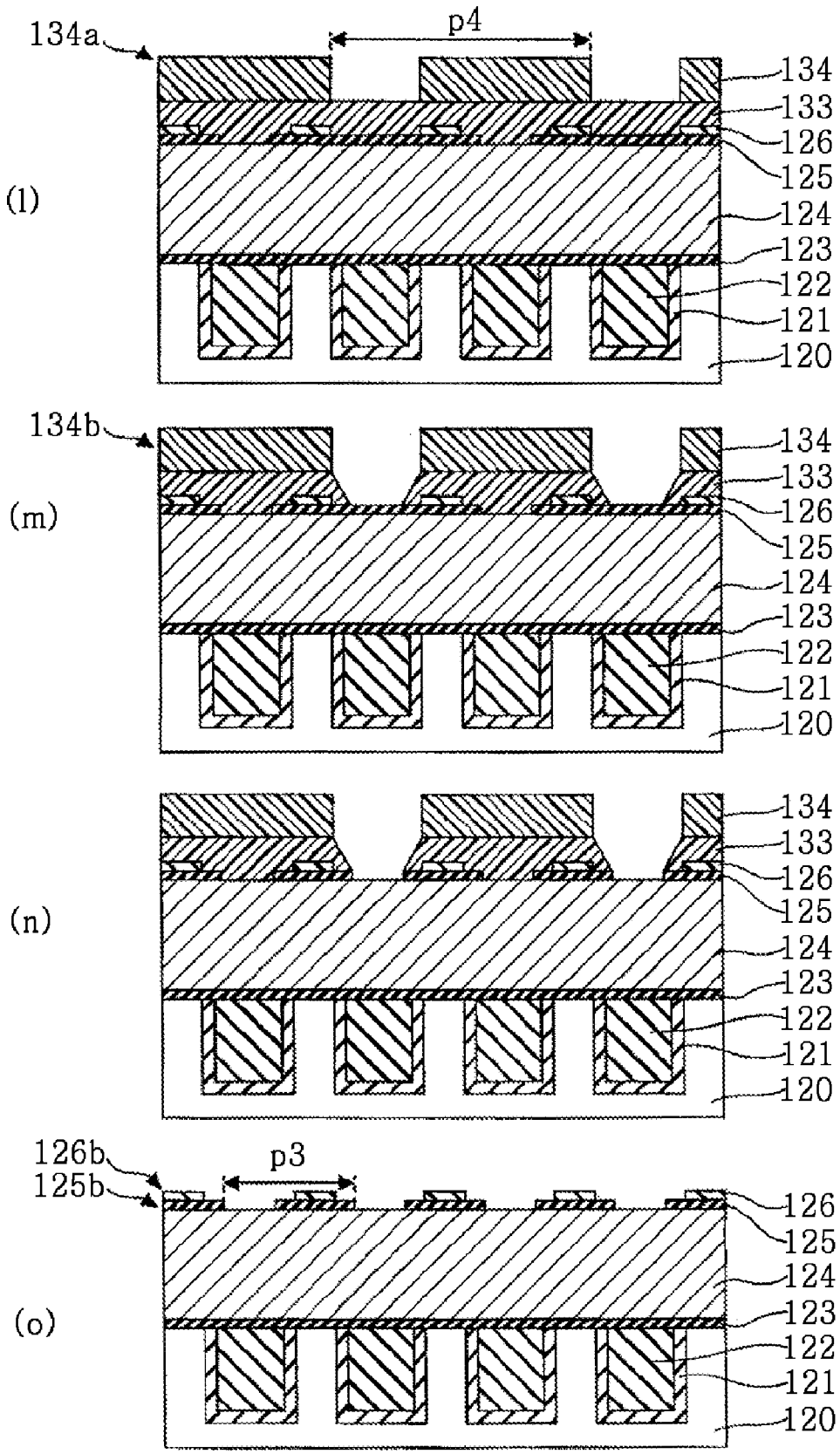
FIG. 5D illustrates fourth schematic cross-sectional views for explaining the method of manufacturing a semiconductor device of FIGS. 4A and 4B, and showing the structure of a minute pattern formed in each operation of the method.

In the semiconductor substrate 120 after the first operation of forming a concave portion-forming mask pattern, an opening portion of the first hard mask layer 125 is formed to correspond to every other opening portion among opening portions of the second hard mask layer 126, and a pattern 125a which has the fourth pitch p4 is formed, as illustrated in FIG. 5C(k). Then, after the second operation of forming a concave portion-forming mask pattern, an opening portion of the first hard mask layer 125 is formed in the semiconductor substrate 120 to correspond to all of the opening portions of the second hard mask layer 126, and a concave portion-forming mask pattern 125b which has a third pitch p3 is formed, as illustrated in FIG. 5D(o).

Figure 5E:
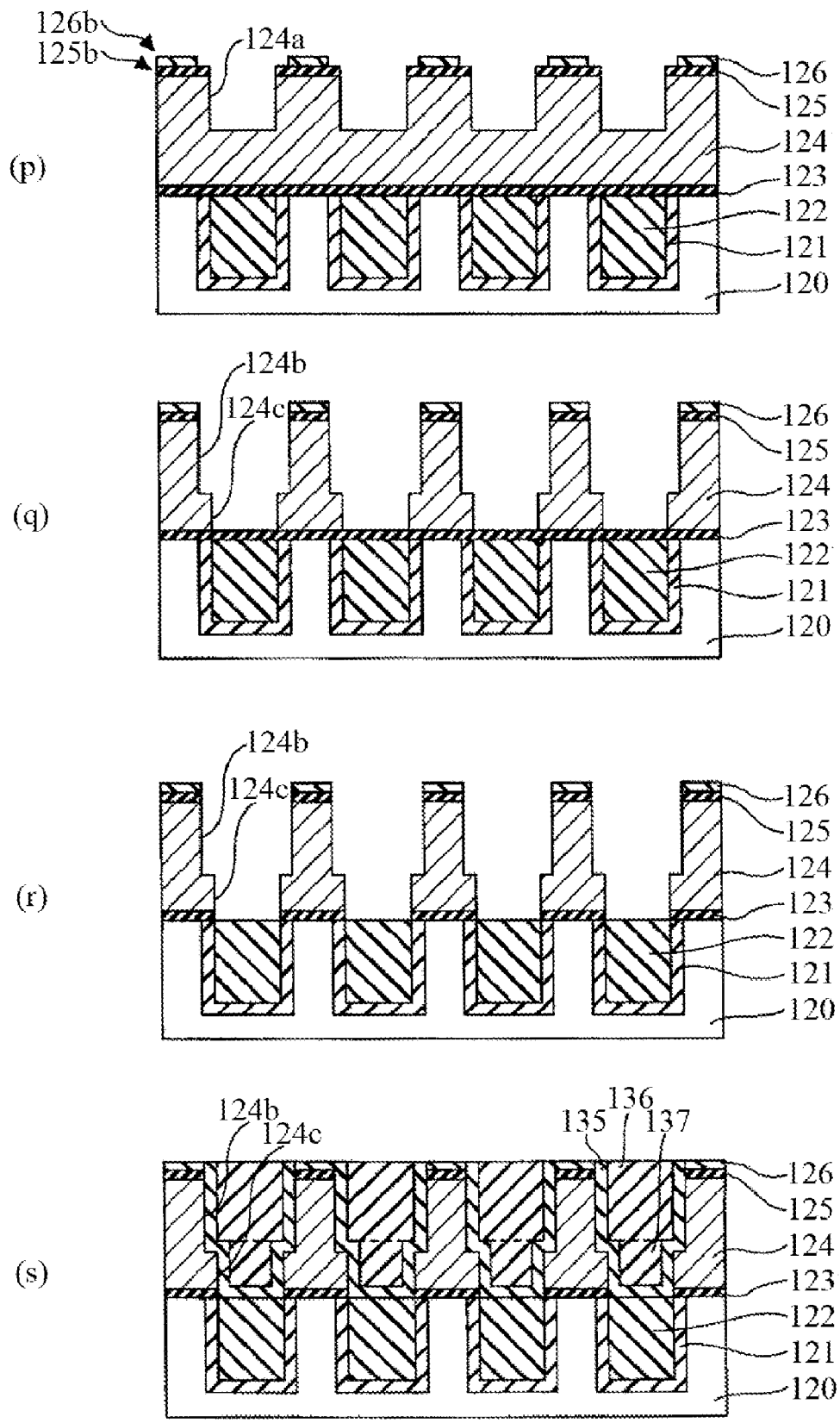
FIG. 5E illustrates fifth schematic cross-sectional views for explaining the method of manufacturing a semiconductor device of FIGS. 4A and 4B, and showing the structure of a minute pattern formed in each operation of the method.

Next, the operation of forming a groove and a concave portion is performed in operations S46 through S48. In the operation of forming a groove and a concave portion, the insulation layer (the layer to be etched) 124 is etched to form a groove (trench) 124b in which the second wiring 136 illustrated in FIG. 5E(s) is formed, and a concave portion (a hole or via) 124c in which the electrode (via electrode) 137 which is formed between the first and second wirings 122 and 136 and connects the first and second wirings 122 and 136 is formed. The operation of forming a groove and a concave portion is the same as the operation of forming a groove and a concave portion performed using operations S23 through S25 of the embodiment of FIGS. 1A and 1B. FIGS. 5E(p) through 5E(r) are cross-sectional views respectively illustrating the structure of the semiconductor substrate 120 after operations S46 through S48 are performed.

In the operation of forming a groove and a concave portion in operations S46 through S48, the insulation layer (the layer to be etched) 124 is etched to form the concave portion 124a and the groove 124b. At the same time, the concave portion 124c formed as the concave portion 124a in operation S46 is etched additionally.

Then, as illustrated in FIG. 5E(s), a barrier metal layer 135 is formed, and the second wiring 136 formed of Cu and the electrode (the via electrode) 137 are formed using a plating method using a seed layer (not shown) and planarized using a CMP method to form a second wiring layer. This is the same as in the embodiment of FIGS. 1A and 1B.

As described above, according to the current embodiment of the present invention, two hard mask layers are used to respectively correspond to the groove-forming mask pattern and the concave portion-forming mask pattern, and thus damage to the insulation layer (the layer to be etched) due to $O_2$ plasma ashing can be prevented. Also, in the operation of forming a concave portion-forming mask pattern, in which a concave portion-forming mask pattern (a hole or via) is formed, an LLE process using a pattern having a tapered opening portion is applied to form a minute, concave portion-forming mask pattern. Consequently, when forming a pattern such as a groove (trench) and a pattern such as a concave portion (a hole or via) below the predetermined resolution limit using a dual damascene method, a transfer accuracy of transferring the pattern such as the groove (trench) and the pattern such as the concave portion (hole or via) to the insulation layer (the layer to be etched) can be increased.

Also, according to the current embodiment of the present invention, a semiconductor device can be manufactured to include a groove, a concave portion formed at a bottom of the groove to have an opening portion that has a smaller size than an opening portion of the groove, a first wiring formed on a semiconductor substrate and under a layer to be etched, a second wiring formed in the groove, and an electrode (a via electrode) formed in the concave portion and connecting the first and second wirings are formed. However, the semiconductor device is not limited to inclusion of the first wiring, the second wiring, and the electrode (the via electrode) connecting the first and second wirings, and thus, a semiconductor including only a groove and a concave portion on a layer to be etched on a semiconductor substrate may be manufactured.

Third Embodiment

Next, referring to FIGS. 6A through 7D, a method of manufacturing a semiconductor device according to another embodiment of the present invention will be described.

Figure 6B:
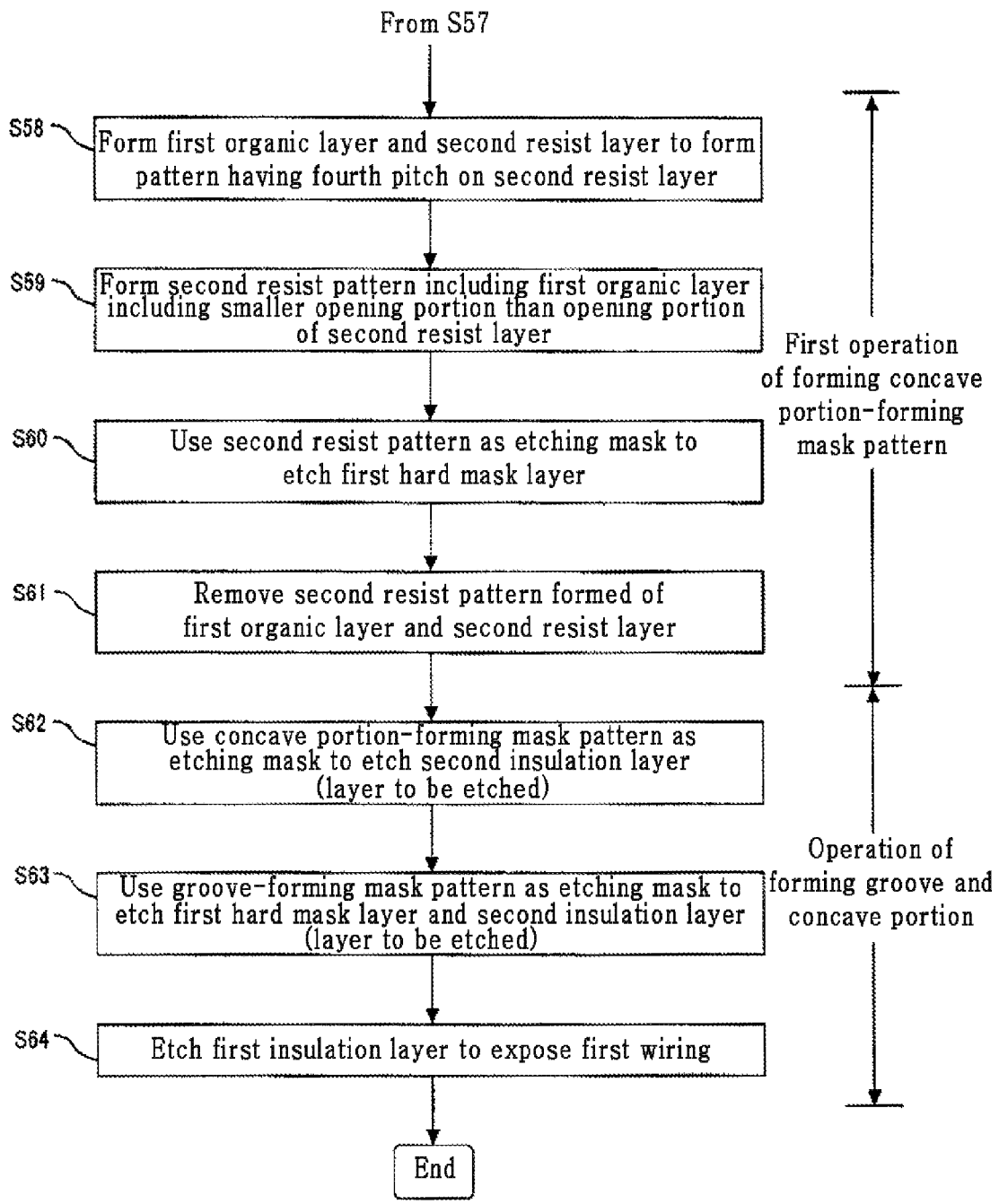
FIG. 6B is a second flowchart illustrating the method of manufacturing a semiconductor device according to the other embodiment of the present invention.

FIGS. 6A and 6B are flowcharts illustrating a method of manufacturing a semiconductor device according to the current embodiment of the present invention. FIGS. 7A through 7D are schematic views illustrating the method of manufacturing a semiconductor device according to the current embodiment of the present invention, and showing minute patterns formed in each operation of the method. Also, the structures of the minute patterns after performing operations S51 through S64 of FIGS. 6A and 6B correspond to the structures illustrated in each of cross-sectional views of FIGS. 7A(a) through 7D(n), respectively. Also, FIG. 7D(o) is a cross-sectional view illustrating the structure of the minute patterns on which a second wiring is formed after the above operations are performed.

The method of manufacturing a semiconductor device according to the current embodiment is different from the method of manufacturing a semiconductor device of the embodiment of FIGS. 1A and 1B in that the operation of forming a groove-forming mask pattern is performed twice (first and second operations of forming a groove-forming mask pattern) and the operation of forming a concave portion-forming mask pattern is performed one time (a first operation of forming a concave portion-forming mask pattern).

That is, in the method of manufacturing a semiconductor device according to the current embodiment, an LLE process of forming a second resist pattern between first resist patterns is performed during the operations of forming a groove-forming mask pattern.

The method of manufacturing a semiconductor device according to the current embodiment of the present invention includes, as shown in FIGS. 6A and 6B, a layer forming operation, a first operation of forming a groove-forming mask pattern, a second operation of forming a groove-forming mask pattern, a first operation of forming a concave portion-forming mask pattern, a second operation of forming a concave portion-forming mask pattern, and an operation of forming a groove and a concave portion. The layer forming operation includes operation S51, the first operation of forming a groove-forming mask pattern includes operations S52 through S54, the second operation of forming a groove-forming mask pattern includes operations S55 through S57, the first operation of forming a concave portion-forming mask pattern includes operations S58 through S61, and the operation of forming a groove and a concave portion includes operations S62 through S64.

In the method of manufacturing a semiconductor device according to the current embodiment, a semiconductor device is manufactured to include a first wiring formed on a semiconductor substrate, a second wiring formed above the first wiring, and an electrode (a via electrode) formed between the first and second wirings and connecting the first and second wirings. The method further includes forming a groove (a trench) and a concave portion (a hole or via) for forming the second wiring and the electrode (the via electrode) after the first wiring is formed.

According to the method of manufacturing a semiconductor device according to the current embodiment, a semiconductor substrate 140 on which a first wiring 142 is formed in advance using a barrier metal layer 141 is provided, like in the embodiment of FIGS. 1A and 1B.

Figure 7A:
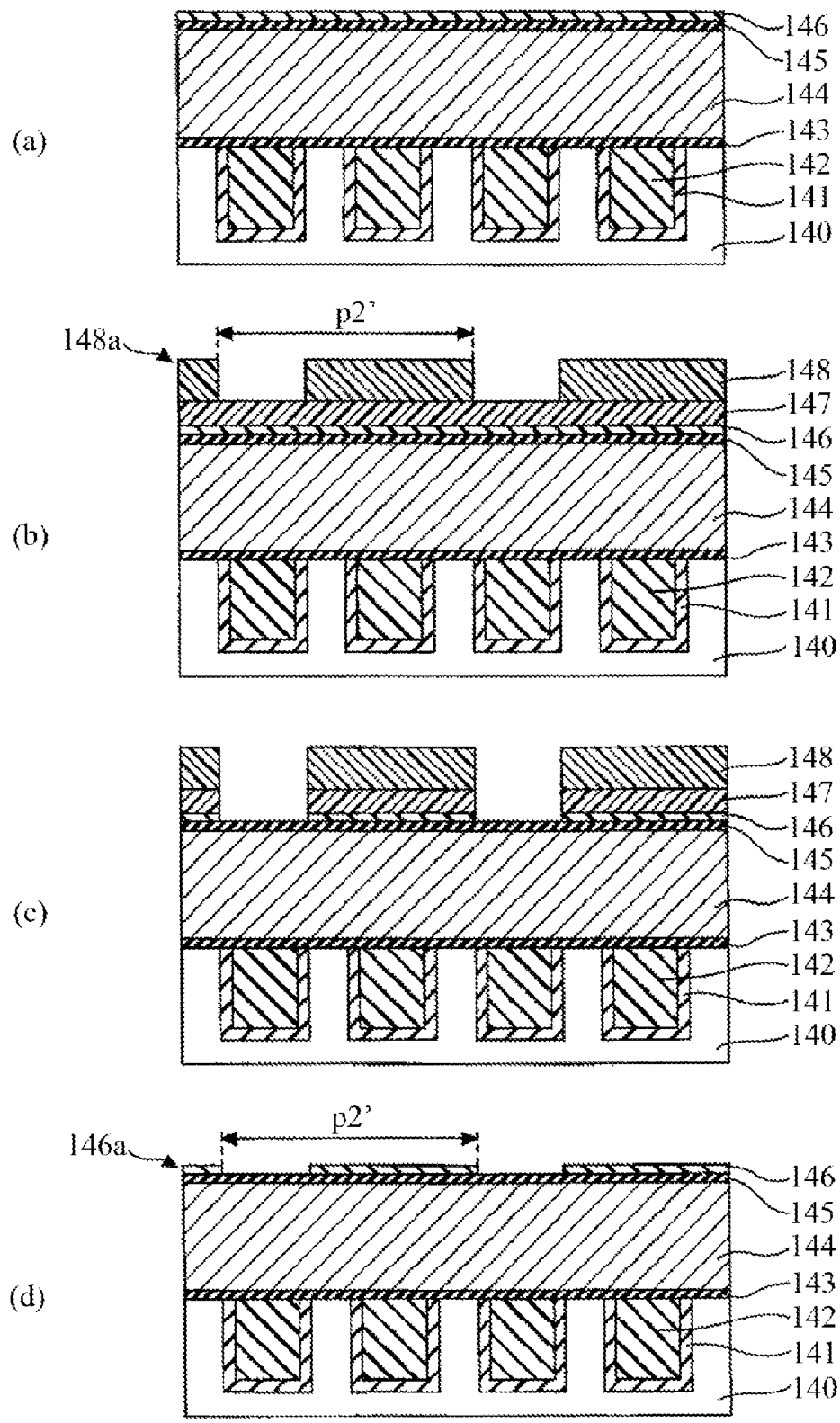
FIG. 7A illustrates first schematic cross-sectional views for explaining the method of manufacturing a semiconductor device of FIGS. 6A and 6B, and showing the structure of a minute pattern formed in each operation of the method.

First, a layer forming operation including operation S51 is formed. Operation S51 is a layer forming operation in which an etching stop layer 143, an insulation layer (a layer to be etched) 144, a first hard mask layer 145, and a second hard mask layer 146 are formed, which is the same as operation S11 of the embodiment of FIGS. 1A and 1B. FIG. 7A(a) is a cross-sectional view illustrating the structure of the semiconductor substrate 140 after operation S51 is performed.

Next, a first operation of forming a groove-forming mask pattern is performed in operations S52 through S54, and a second operation of forming a groove-forming mask pattern is performed in operations S55 through S57. In the first and second operations of forming a groove-forming mask pattern, a groove-forming mask pattern 146b, which has a first pitch p1, is formed of the second hard mask layer 146 and is used as a mask when forming a groove (trench) 144b on which a second wiring 154 illustrated in FIG. 7D(o) is formed. These operations are the same as the first operation of forming a groove-forming mask pattern performed in operations S32 through S34 and the second operation of forming a groove-forming mask pattern performed in operations S35 through S37 of the embodiment of FIGS. 4A and 4B. FIGS. 7A(b) through 7B(g) are cross-sectional views illustrating the structure of the semiconductor substrate 140 after the above operations are performed.

Figure 7B:
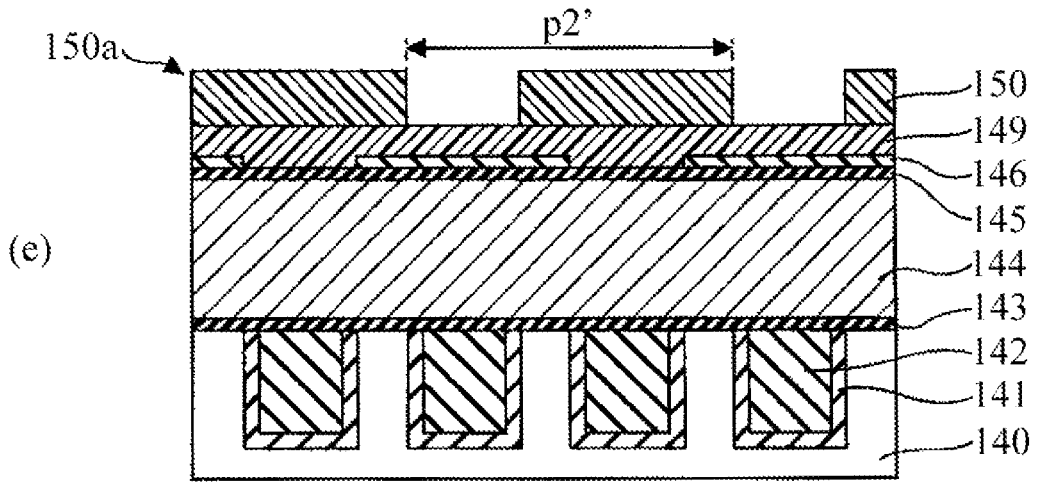
FIG. 7B illustrates second schematic cross-sectional views for explaining the method of manufacturing a semiconductor device of FIGS. 6A and 6B, and showing the structure of a minute pattern formed each operations of the method.
Figure 7B:
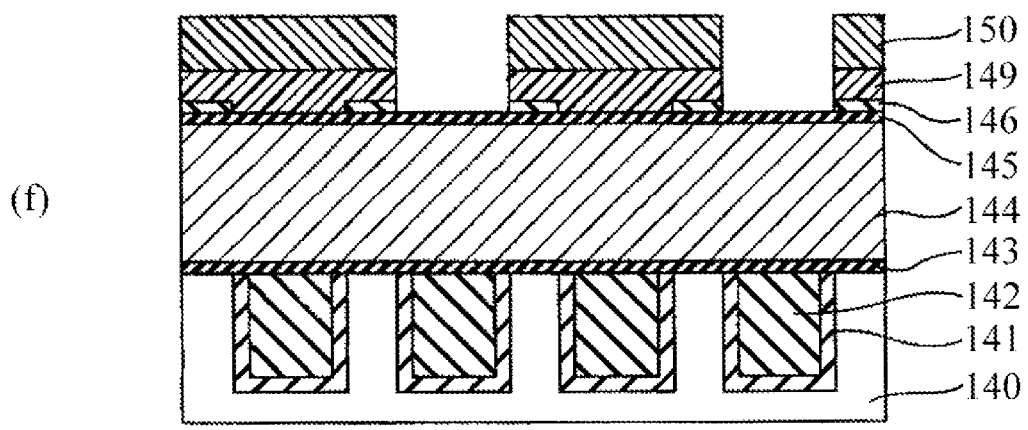
Figure 7B:
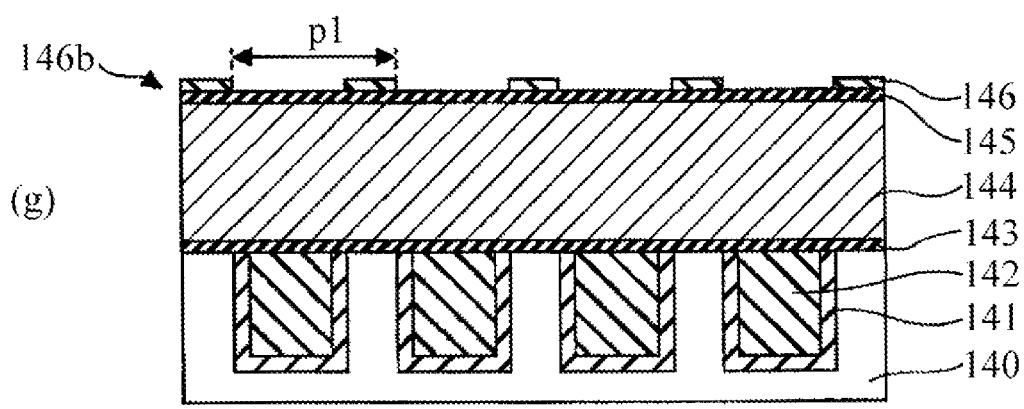

After the first operation of forming a concave portion-forming mask pattern, a pattern 146a having a second pitch p2' as illustrated in FIG. 7A(d) is formed in the semiconductor substrate 140, and after the second operation of forming a concave portion-forming mask pattern, the groove-forming mask pattern 146b which has the first pitch p1 as illustrated in FIG. 7B(g) is formed on the semiconductor substrate 140.

Also, in the current embodiment, in operations S54 through S57, when resist patterns 148a and 150a and BARC layers 147 and 149 are removed using an $O_2$ plasma ashing method, since the insulation layer 144 is coated with the first hard mask layer 145, deterioration of the characteristics or the form of the insulation layer 144, which is formed of a low-k layer does not occur.

Next, the first operation of forming a concave portion-forming mask pattern is performed in operations S58 through S61. In the first operation of forming a concave portion-forming mask pattern, a concave portion-forming mask pattern 145a, which has the third pitch p3, is formed of the first hard mask layer 145, and is used as a mask when forming a concave portion (a hole or via) 144c on which an electrode (a via electrode) 155 is formed. The electrode 155 is disposed between a first wiring 142 and a second wiring 154 illustrated in FIG. 7D(o) and connects the first wiring 142 and the second wiring 154.

In the current embodiment, the third pitch p3 is identical to the first pitch p1, and a fourth pitch p4' is identical to the third pitch. Thus, by performing an operation of forming a concave portion-forming mask pattern one time (the first operation of forming a concave portion-forming mask pattern), opening portions of the first hard mask layer 145 is formed to respectively correspond to all opening portions of the second hard mask layer 146 in the semiconductor substrate 140.

Figure 7C:
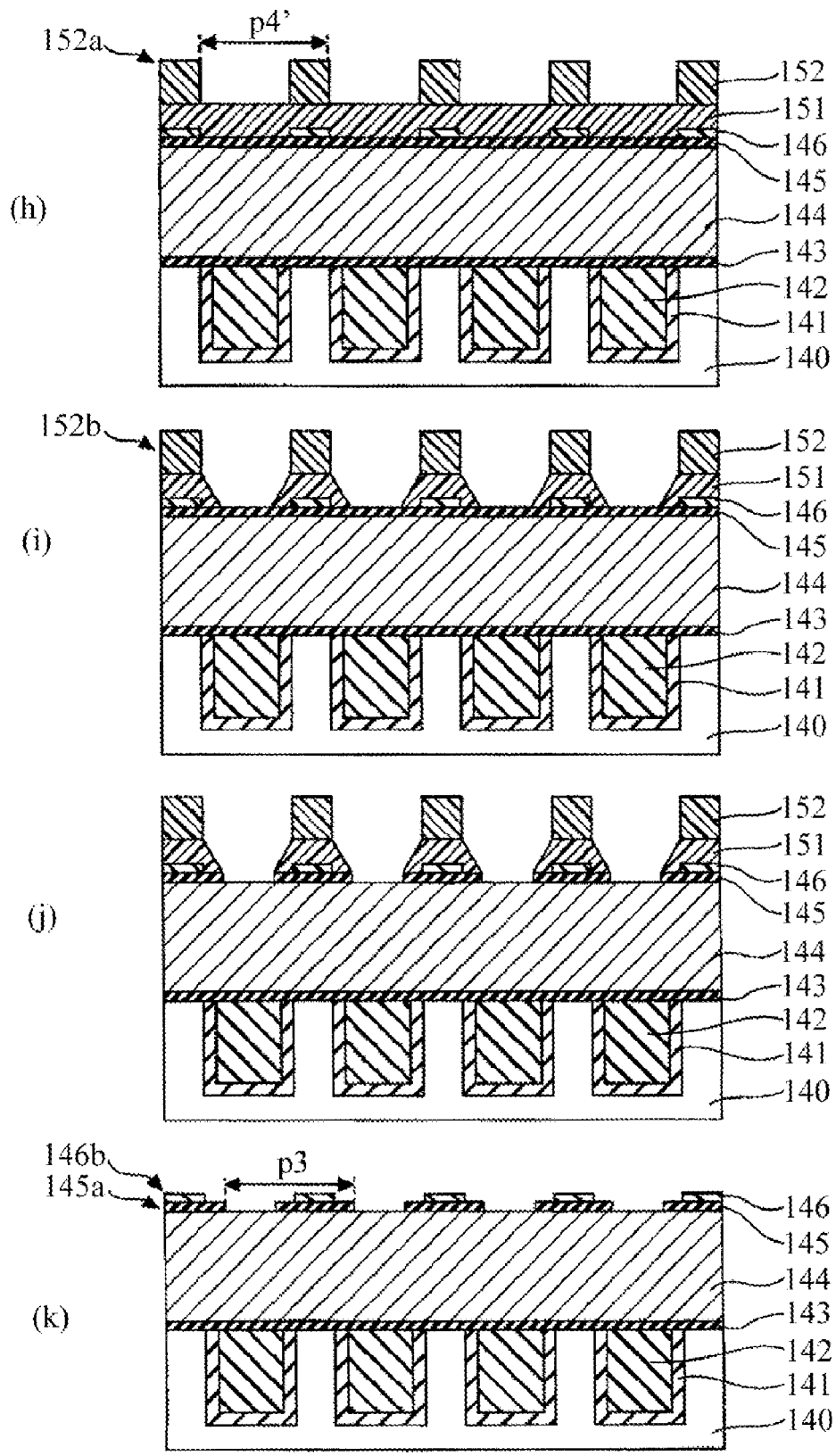
FIG. 7C illustrates third schematic cross-sectional views for explaining the method of manufacturing a semiconductor device of FIGS. 6A and 6B, and showing the structure of a minute pattern formed in each operation of the method.

In operation S58, a first organic layer 151 and a second resist layer 152 are formed to form a pattern 152a, which has the fourth pitch p4', on the second resist layer 152, which is the same as operation S15 of the embodiment of FIGS. 1A and 1B. FIG. 7C(h) is a cross-sectional view illustrating the structure of the semiconductor substrate 140 after operation S58 is performed.

In operation S59, the pattern 152a is used as an etching mask to etch the first organic layer 151 to thereby form a second resist pattern 152b, which is the same as operation S16 of the embodiment of FIGS. 1A and 1B. FIG. 7C(i) is a cross-sectional view illustrating the structure of the semiconductor substrate 140 after operation S59 is performed.

Also, in operation S59, the conditions for plasma-etching a sidewall surface of the opening portion of the first organic layer 151 in a tapered form may be the same as the conditions of the plasma-etching of the sidewall surface of the opening portion of the first organic layer 109 of operation S16 of the embodiment of FIGS. 1A and 1B.

In operation S60, the second resist pattern 152b is used as an etching mask to etch the first hard mask layer 145, which is the same as operation S17 of the embodiment of FIGS. 1A and 1B. FIG. 7C(j) is a cross-sectional view illustrating the structure of the semiconductor substrate 140 after operation S60 is performed.

In operation S61, the second resist pattern 152b is removed, which is the same as operation S18 of the embodiment of FIGS. 1A and 1B. FIG. 7C(k) is a cross-sectional view illustrating the structure of the semiconductor substrate 140 after operation S61 is performed.

As described above, by performing operations S58 through S61, the concave-forming mask pattern 145a, which has the third pitch p3, is formed of the first hard mask layer 145 as illustrated in FIG. 7C(k).

Figure 7D:
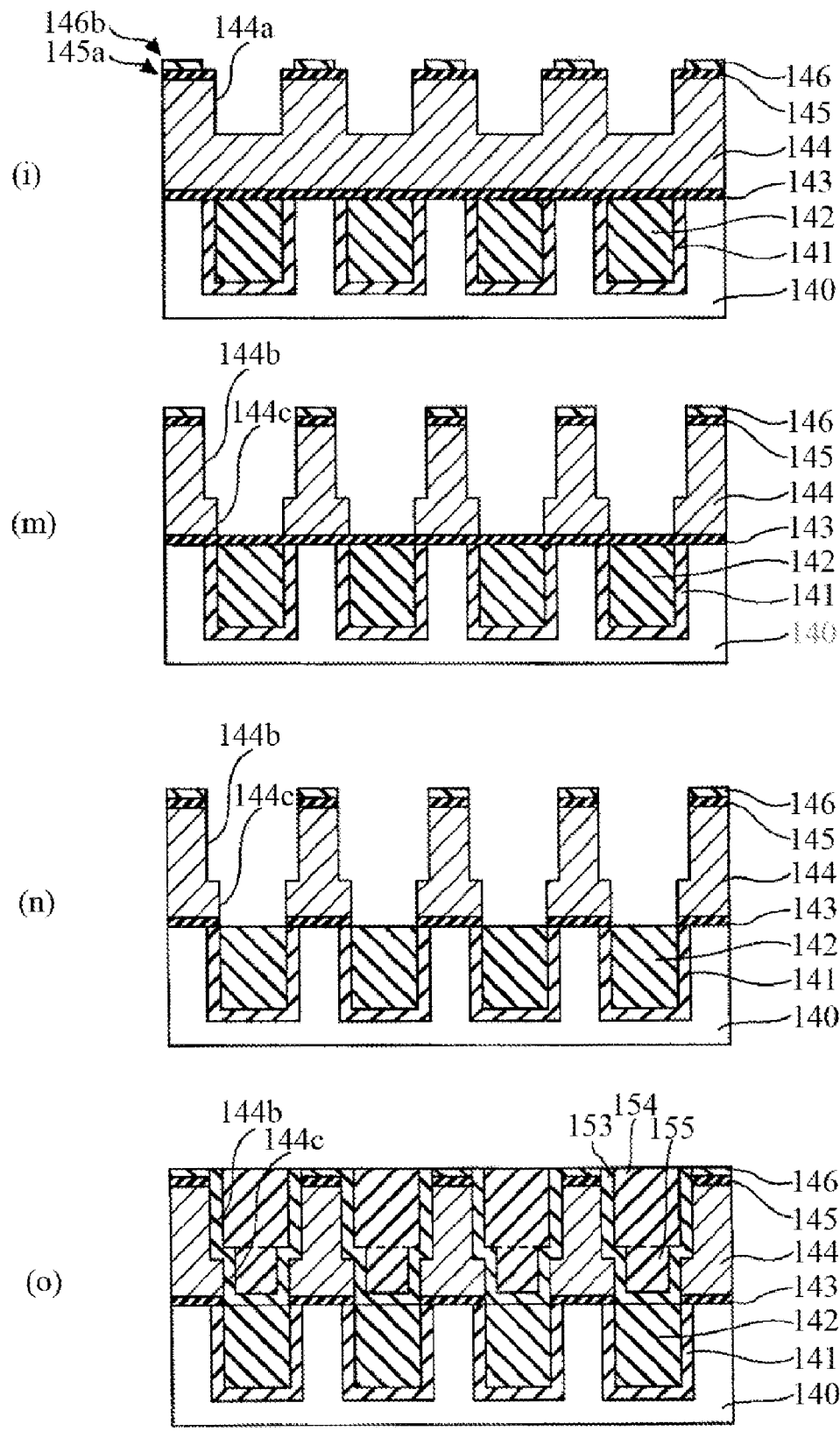
FIG. 7D illustrates fourth schematic cross-sectional views for explaining the method of manufacturing a semiconductor device of FIGS. 6A and 6B, and showing the structure of a minute pattern formed in each operation of the method.

Next, the operation of forming a groove and a concave portion is performed using operations S62 through S64. In the operation of forming a groove and a concave portion, the insulation layer (the layer to be etched) 144 is etched to form a groove (trench) 144b, in which the second wiring 154 illustrated in FIG. 7D(o) is formed, and a concave portion (a hole or via) 144c, in which the electrode (via electrode) 155 is formed between the first and second wirings 142 and 154 to connect the first and second wirings 142 and 154, is formed. The operation of forming a groove and a concave portion according to the current embodiment is the same as the operation of forming a groove and a concave portion in operations S23 through S25 of the embodiment of FIGS. 1A and 1B. FIGS. 7D(l) through 7D(n) are cross-sectional views respectively illustrating the structure of the semiconductor substrate 140 after operations S62 through S64 are performed.

In the operation of forming a groove and a concave portion in operations S62 through S64, the insulation layer (the layer to be etched) 144 is etched to form a concave portion 144a and the groove 144b. At the same time, the concave portion 144c formed as the concave portion 144a in operation S62 is further etched.

Then, as illustrated in FIG. 7D(o), a barrier metal layer 153 is formed, and the second wiring 154 formed of Cu and the electrode (the via electrode) 155 are formed using a plating method using a seed layer (not shown) and planarized using a CMP method to form a second wiring layer, which is the same as in the embodiment of FIGS. 1A and 1B.

As described above, according to the current embodiment of the present invention, two hard mask layers are used to respectively correspond to the groove-forming mask pattern and the concave portion-forming mask pattern, and thus damage to the insulation layer (the layer to be etched) due to $O_2$ plasma ashing can be prevented. Also, in the operation of forming a concave portion-forming mask pattern, in which a concave portion-forming mask pattern (a hole or via) is formed, an LLE process using a pattern having a tapered opening portion is used to form a minute, concave portion-forming mask pattern. Consequently, when forming a pattern such as a groove (trench) and a pattern such as a concave portion (a hole or via) below a predetermined resolution limit using a dual damascene method, a transfer accuracy of transferring the pattern such as the groove (trench) and the pattern such as the concave portion (hole or via) to the insulation layer (the layer to be etched) can be increased.

Also, according to the current embodiment of the present invention, a semiconductor device can be manufactured to include a groove, a concave portion formed at a bottom of the groove and having an opening portion that has a smaller size than an opening portion of the groove, a first wiring formed on a semiconductor substrate and under a layer to be etched, a second wiring formed in the groove, and an electrode (a via electrode) formed in the concave portion and connecting the first and second wirings. However, the semiconductor device is not limited to inclusion of the first wiring, the second wiring, and the electrode (the via electrode) connecting the first and second wirings, and thus, a semiconductor including only a groove and a concave portion on a layer to be etched on a semiconductor substrate may be manufactured.

Fourth Embodiment

Next, a method of manufacturing a semiconductor device according to another embodiment of the present invention will be described with reference to FIGS. 8 through 9C.

Figure 8:
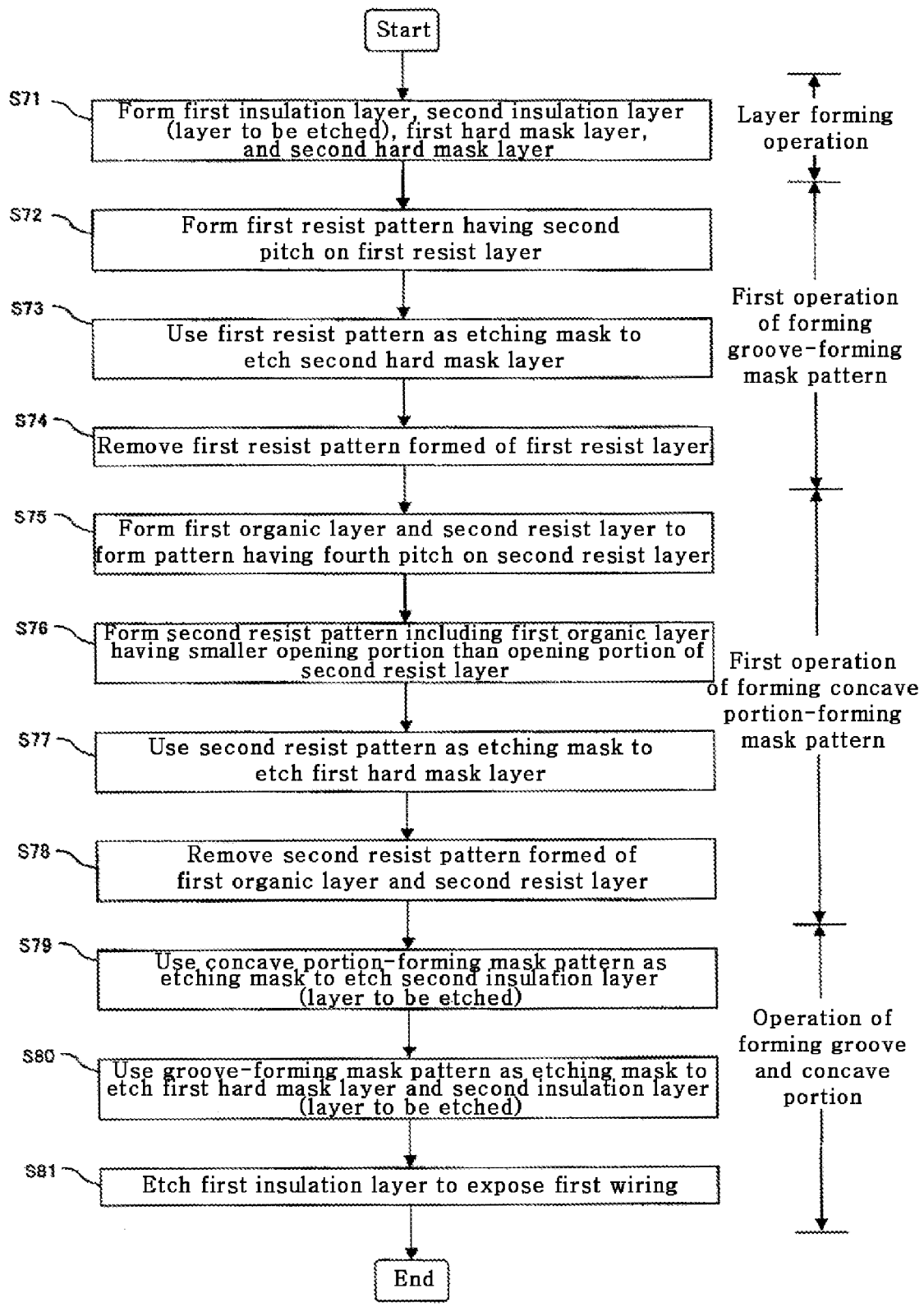
FIG. 8 is a flowchart illustrating a method of manufacturing a semiconductor device according to other embodiment of the present invention.
Figure 9A:
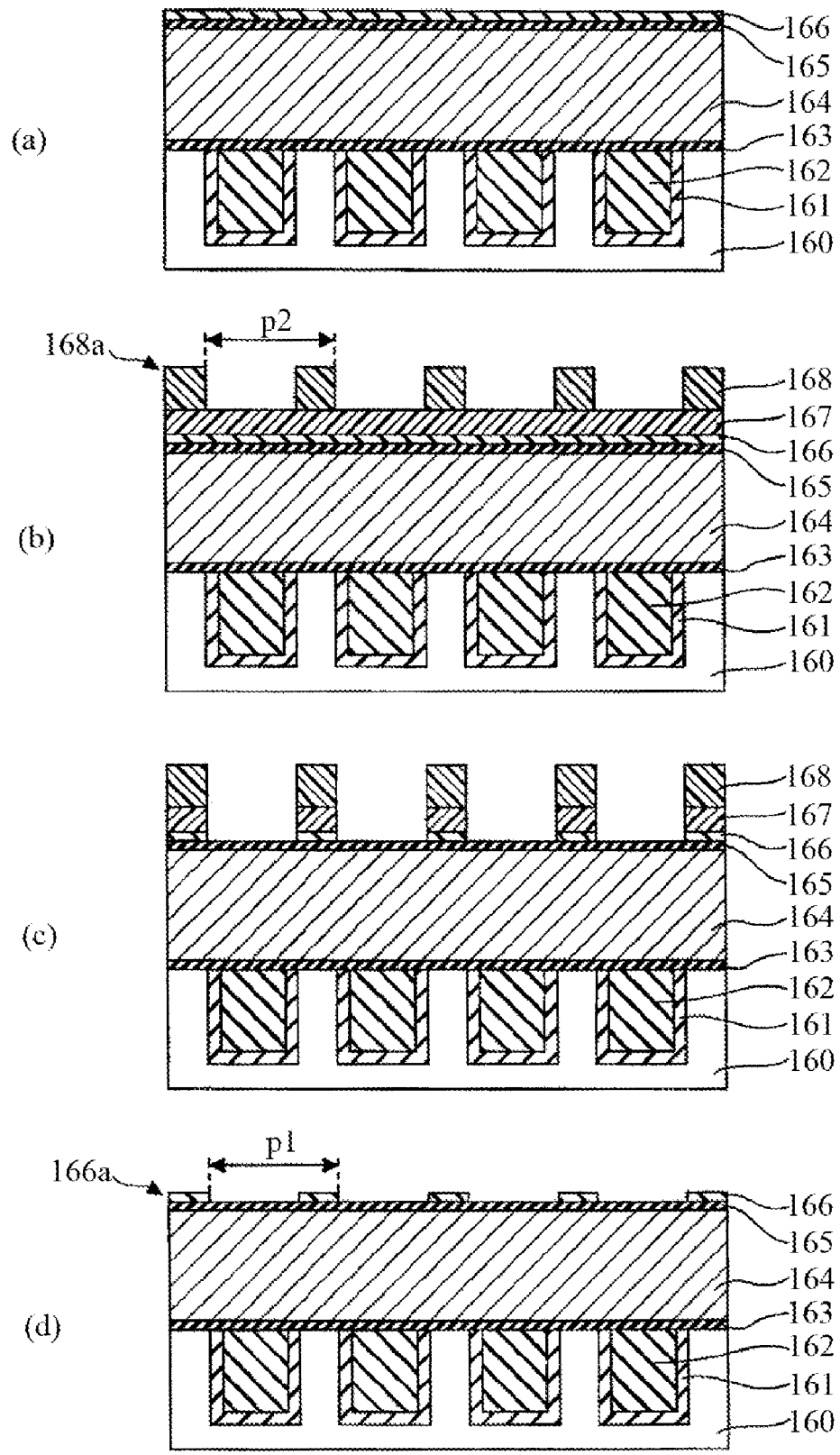
FIG. 9A illustrates first schematic cross-sectional views for explaining the method of manufacturing a semiconductor device of FIG. 8, and showing the structure of a minute pattern formed in each operation of the method.
Figure 9B:
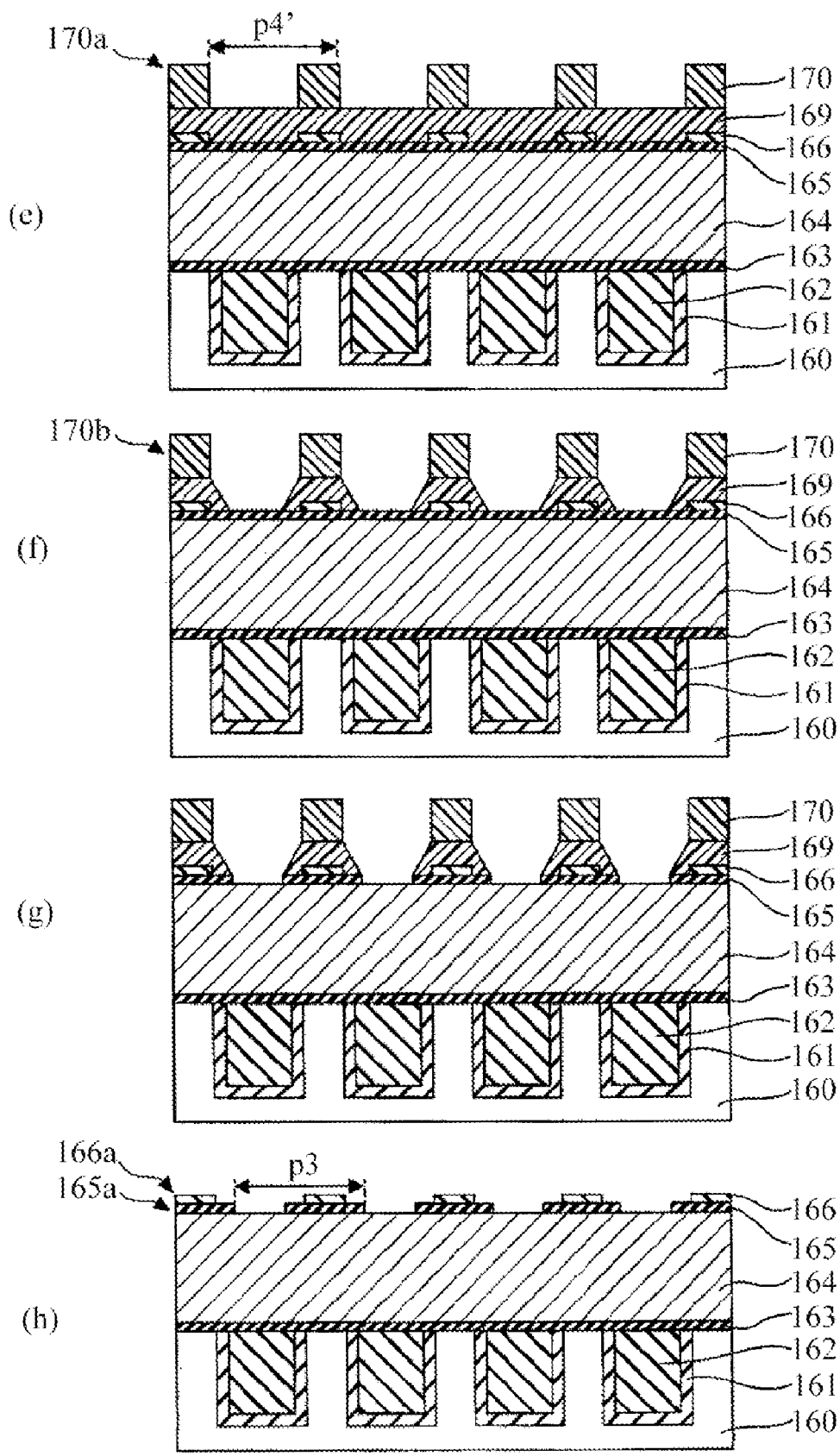
FIG. 9B illustrates second schematic cross-sectional views for explaining the method of manufacturing a semiconductor device of FIG. 8, and showing the structure of a minute pattern formed in each operation of the method.

FIG. 8 is a flowchart illustrating the method of manufacturing a semiconductor device according to another embodiment of the present invention. FIGS. 9A through 9C are cross-sectional views for explaining the method of manufacturing a semiconductor device according to the current embodiment, and show minute patterns formed in each operation of the method. The minute patterns formed in operations S71 through S81 of FIG. 8 correspond to the structures illustrated in the cross-sectional views of FIGS. 9A(a) through 9C(k), respectively. Also, FIG. 9C(l) is a cross-sectional view illustrating the structure of the minute patterns on which a second wiring is formed after the above operations are performed.

The method of manufacturing a semiconductor device according to the current embodiment is different from the embodiment of FIGS. 1A and 1B in that an operation of forming a groove-forming mask pattern (a first operation of forming a groove-forming mask pattern) is performed one time, and an operation of forming a concave portion-forming mask pattern (a first operation of forming a concave portion-forming mask pattern) is performed one time.

That is, according to the method of manufacturing a semiconductor device according to the current embodiment, the LLE process is performed neither in the operation of forming a groove-forming mask pattern nor in the operation of forming a concave portion-forming mask pattern.

The method of manufacturing a semiconductor device according to the current embodiment of the present invention includes, as shown in FIG. 8, a layer forming operation, a first operation of forming a groove-forming mask pattern, a first operation of forming a concave portion-forming mask pattern, and an operation of forming a groove and a concave portion. The layer forming operation includes operation S71, the first operation of forming a groove-forming mask pattern includes operations S72 through S74, the first operation of forming a concave portion-forming mask pattern includes operations S75 through S78, and the operation of forming a groove and a concave portion includes operations S79 through S81.

In the method of manufacturing a semiconductor device according to the current embodiment, a semiconductor device including a first wiring formed on a semiconductor substrate, a second wiring formed above the first wiring, and an electrode (a via electrode) that is formed between the first and second wirings and connecting the first and second wirings is manufactured. The method further includes forming a groove (a trench) and a concave portion (a hole or via) for forming the second wiring and the electrode (via electrode) after the first wiring is formed.

According to the method of manufacturing a semiconductor device according to the current embodiment, a semiconductor substrate 160 on which a first wiring 162 is formed in advance using a barrier metal layer 161 is provided, which is the same as in the embodiment of FIGS. 1A and 1B.

First, a layer forming operation is performed in operation S71. Operation S71 is a layer forming operation in which an etching stop layer 163, an insulation layer (a layer to be etched) 164, a first hard mask layer 165, and a second hard mask layer 166 are formed, which is the same as operation S11 of the embodiment of FIGS. 1A and 1B. FIG. 9A(a) is a cross-sectional view illustrating the structure of the semiconductor substrate 160 after operation S71 is performed.

Next, the first operation of forming a groove-forming mask pattern is performed in operations S52 through S54. In the first operation of forming a mask pattern, a groove-forming mask pattern 166a, which is a pattern which has the first pitch p1, is formed of the second hard mask layer 166, and is used as a mask when forming a groove (trench) 164b on which a second wiring 172 illustrated in FIG. 9C(l) is formed. The first operation of forming a groove-forming mask pattern is the same as the first operation of forming a groove-forming mask pattern in operations S12 through S14 of the embodiment of FIGS. 1A and 1B. FIGS. 9A(b) through 9A(d) are cross-sectional views illustrating the structure of the semiconductor substrate 160 after the above operations S72 through S74 are performed.

Next, the first operation of forming a concave portion-forming mask pattern is performed in operations S75 through S78. In the first operation of forming a concave portion-forming mask pattern, a concave portion-forming mask pattern 165a, which has the third pitch p3, is formed of the first hard mask layer 165, and is used as a mask when forming a concave portion (a hole or via) 164c on which an electrode a (via electrode) 173 is formed. The electrode 173 is disposed between a first wiring 162 and a second wiring 172 illustrated in FIG. 9C(l) and connects the first wiring 162 and the second wiring 172. Also, the first operation of forming a concave portion-forming mask pattern according to the current embodiment is the same as the first operation of forming a concave portion-forming mask pattern performed in operations S58 through S61 of the embodiment of FIGS. 6A and 6B. FIGS. 9B(e) through 9B(h) are cross-sectional views respectively illustrating the structure of the semiconductor substrate 160 after operations S75 through S78 are performed.

Also, in operation S76, the conditions for plasma-etching a sidewall surface of an opening portion of a first organic layer 169 in a tapered shape may be the same as the conditions of the plasma-etching of the sidewall surface of the opening portion of the first organic layer 109 in operation S16 of the embodiment of FIGS. 1A and 1B.

Next, the operation of forming a groove and a concave portion is performed using operations S79 through S81. In the operation of forming a groove and a concave portion, the insulation layer (the layer to be etched) 164 is etched to form a groove (trench) 164b in which the second wiring 172 illustrated in FIG. 9C(l) is formed, and a concave portion (a hole or via) 164c, in which the electrode (the via electrode) 173 which is formed between the first and second wirings 162 and 172 and connects the first and second wirings 162 and 172, is formed. The operation of forming a groove and a concave portion is the same as the operation of forming a groove and a concave portion performed using operations S23 through S25 of the embodiment of FIGS. 1A and 1B. FIGS. 9C(i) through 9C(k) are cross-sectional views respectively illustrating the structure of the semiconductor substrate 160 after operations S79 through S81 are performed.

In the operation of forming a groove and a concave portion in operations S79 through S81, the insulation layer (the layer to be etched) 164 is etched to form a concave portion 164a and the groove 164b, and at the same time, the concave portion 164c is formed.

Figure 9C:
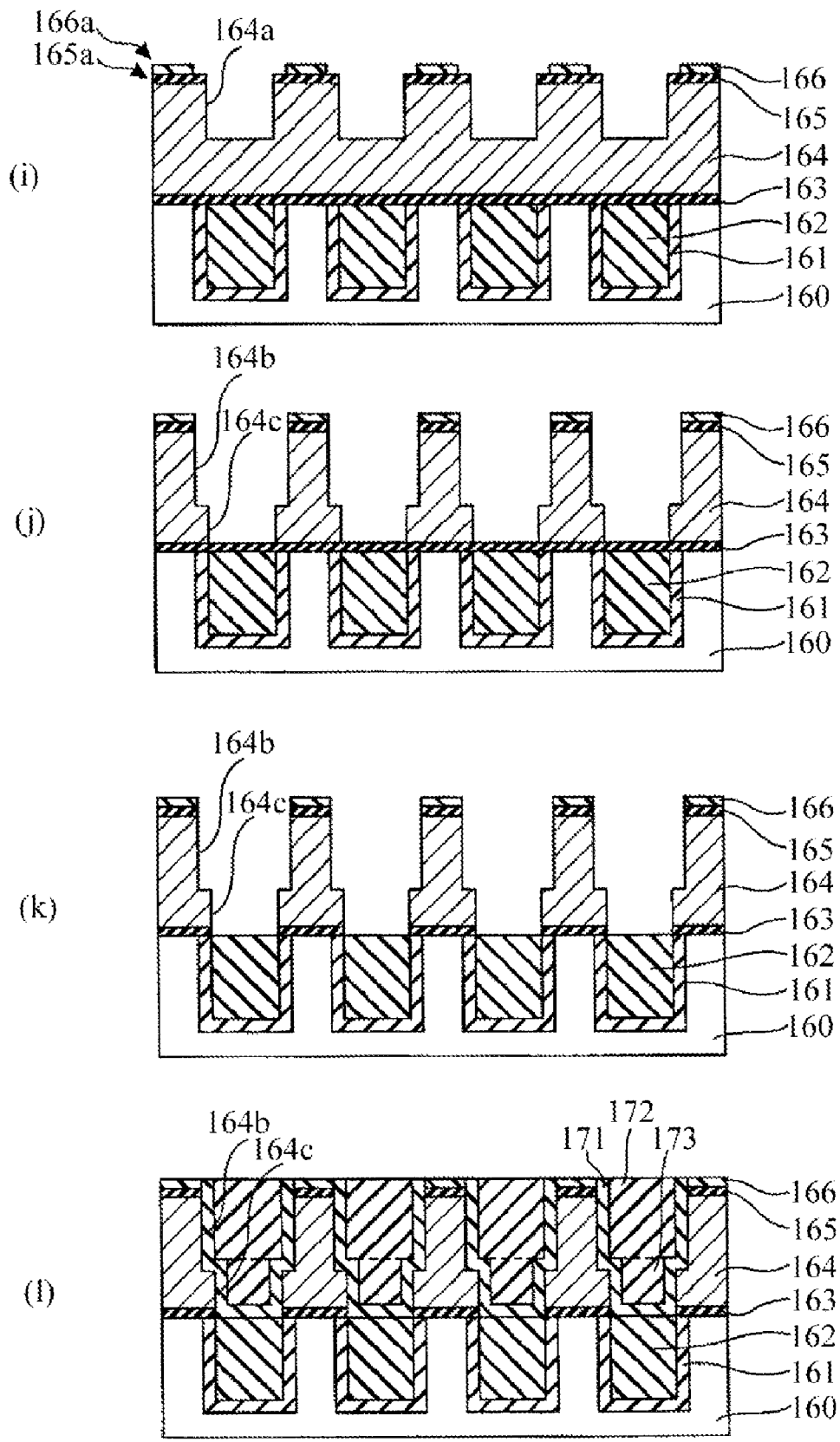
FIG. 9C illustrates third schematic cross-sectional views for explaining the method of manufacturing a semiconductor device of FIG. 8, and showing the structure of a minute pattern formed in each operation of the method.

Then, as illustrated in FIG. 9C(l), a barrier metal layer 171 is formed, and the second wiring 172 formed of Cu and the electrode (the via electrode) 173 are formed using a plating method using a seed layer (not shown) and planarized using a CMP method to form a second wiring layer, which is the same as in the embodiment of FIGS. 1A and 1B.

As described above, according to the current embodiment of the present invention, two hard mask layers are used to respectively correspond to the groove-forming mask pattern and the concave portion-forming mask pattern, and thus damage to the insulation layer (the layer to be etched) due to $O_2$ plasma ashing can be prevented. Also, in the operation of forming a concave portion-forming mask pattern, in which a concave portion-forming mask pattern (a hole or via) is formed, a minute, concave portion-forming mask pattern can be formed using a pattern having a tapered opening portion. Consequently, when forming a pattern such as a groove (a trench) and a pattern such as a concave portion (a hole or via) below the resolution limit using a dual damascene method, a transfer accuracy of transferring the pattern such as the groove (trench) and the pattern such as the concave portion (hole or via) to the insulation layer (layer to be etched) can be increased.

Also, according to the current embodiment of the present invention, a semiconductor device can be manufactured to include a groove, a concave portion formed at a bottom of the groove and having an opening portion that has a smaller size than an opening portion of the groove, a first wiring formed on a semiconductor substrate and under a layer to be etched, a second wiring formed in the groove, and an electrode (via electrode) formed in the concave portion and connecting the first and second wirings. However, the semiconductor device is not limited to inclusion of the first wiring, the second wiring, and the electrode (via electrode) connecting the first and second wirings, and thus, a semiconductor including only a groove and a concave portion on a layer to be etched on a semiconductor substrate may be manufactured.

According to the present invention, the CDs of minute patterns such as grooves (trenches) and holes (vias) can be formed with high accuracy when forming multi-layer Cu wiring patterns below a predetermined resolution limit using a dual damascene method.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of manufacturing a semiconductor device, the semiconductor device comprising a semiconductor substrate and a layer to be etched formed on the semiconductor substrate, wherein a groove and a concave portion are formed in the layer to be etched, and the concave portion is formed at a bottom of the groove and has a smaller opening portion than an opening portion of the groove, the method comprising:
   sequentially forming a first hard mask layer and a second hard mask layer on the layer to be etched;
   a first groove-forming mask pattern forming process which forms a groove-forming mask pattern which has a first pitch, is formed of the second hard mask layer, and is used as an etching mask when forming groove patterns, by
      forming a first resist layer on the second hard mask layer in order to form a first resist pattern that has a second pitch and is formed of the first resist layer, and
      etching the second hard mask layer using the first resist pattern as an etching mask; and
   a first concave portion-forming mask pattern forming process which forms a concave portion-forming mask pattern which has a third pitch substantially identical to the first pitch, is formed of the first hard mask layer, and is used as an etching mask when forming concave portion patterns, by
      sequentially forming a first organic layer and a second resist layer on the first hard mask layer, on which the groove-forming mask pattern is formed, in order to form a second resist pattern comprising the second resist layer having an opening portion that has a fourth pitch and the first organic layer having an opening portion that is connected to an opening portion of the second resist layer and has a smaller size than the opening portion of the second resist layer, and
      etching the first hard mask layer using the second resist pattern as an etching mask.

2. The method of claim 1, wherein the fourth pitch is larger than the third pitch, and
   after the first concave portion-forming mask pattern forming process, the method further comprising a second concave portion-forming mask pattern forming process which comprises:
      sequentially forming a second organic layer and a third resist layer in order to form a third resist pattern comprising the third resist layer having an opening portion that has the fourth pitch and the second organic layer that has an opening portion that is connected to an opening portion of the third resist layer and has a smaller size than the opening portion of the third resist layer, and
      etching the first hard mask layer using the third resist pattern as an etching mask.

3. The method of claim 1, wherein the second pitch is larger than the first pitch, and
   after the first groove-forming mask pattern forming process, the method further comprising a second groove-forming mask pattern forming process which comprises:
      forming a fourth resist layer in order to form a fourth resist pattern which has the second pitch and is formed of the fourth resist layer, and
      etching the second hard mask layer by using the fourth resist pattern as an etching mask.

4. The method of claim 1, further comprising:
groove and concave portion forming process for forming a groove and a concave portion, by etching the layer to be etched by using the concave portion-forming mask pattern formed of the first hard mask layer as an etching mask, and etching the first hard mask layer and the layer to be etched by using the groove-forming mask pattern formed of the second hard mask layer as an etching mask.

5. The method of claim 1, wherein the semiconductor device further comprises:
a first wiring that is formed on the semiconductor substrate and under the layer to be etched;
a second wiring formed in the groove; and
an electrode that is formed in the concave portion and connects the first wiring and the second wiring.

6. The method of claim 1, wherein an opening portion of the first organic layer has a tapered sidewall surface.

7. The method of claim 2, wherein an opening portion of the second organic layer has a tapered sidewall surface.

8. The method of claim 6, wherein the sidewall surface of the opening portion of the first organic layer is formed by attaching a reactant product of an etching gas to the sidewall surface of the opening portion of the first organic layer and etching the sidewall surface.

9. The method of claim 7, wherein the sidewall surface of the opening portion of the second organic layer is formed by attaching a reactant product of an etching gas to the sidewall surface of the opening portion of the second organic layer and etching the sidewall surface.

10. The method of claim 8, wherein the etching gas comprises one of $CF_4$ and $CHF_3$.

11. The method of claim 9, wherein the etching gas comprises one of $CF_4$ and $CHF_3$.

* * * * *